(12) United States Patent
Takiguchi et al.

(10) Patent No.: US 11,107,471 B2
(45) Date of Patent: Aug. 31, 2021

(54) DIALOG PROCESSING SERVER, CONTROL METHOD FOR DIALOG PROCESSING SERVER, AND TERMINAL

(71) Applicant: HONDA MOTOR CO., LTD., Tokyo (JP)

(72) Inventors: Chikashi Takiguchi, Wako (JP); Manabu Ichikawa, Wako (JP); Takao Yamamoto, Wako (JP); Satoshi Honma, Tokyo (JP); Tatsuya Ryuzaki, Wako (JP); Susumu Saito, Wako (JP); Atsushi Ito, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 197 days.

(21) Appl. No.: 16/475,199

(22) PCT Filed: Jan. 20, 2017

(86) PCT No.: PCT/JP2017/001871
§ 371 (c)(1),
(2) Date: Jul. 1, 2019

(87) PCT Pub. No.: WO2018/134960
PCT Pub. Date: Jul. 26, 2018

(65) Prior Publication Data
US 2019/0318740 A1    Oct. 17, 2019

(51) Int. Cl.
*G06F 30/27*    (2020.01)
*G10L 15/22*    (2006.01)
(Continued)

(52) U.S. Cl.
CPC ........ *G10L 15/22* (2013.01); *G06F 16/90332* (2019.01); *G06F 30/27* (2020.01); *G06N 5/022* (2013.01)

(58) Field of Classification Search
CPC ..... G06F 30/27; G06F 16/90332; G10L 15/22
See application file for complete search history.

(56) References Cited

U.S. PATENT DOCUMENTS

2009/0248505 A1* 10/2009 Finkelstein ........ G06Q 30/0234
   705/14.16
2012/0221502 A1   8/2012 Jerram et al.
(Continued)

FOREIGN PATENT DOCUMENTS

JP    H11-126163    5/1999
JP    2002-216026   8/2002
(Continued)

OTHER PUBLICATIONS

Ichiro Kobayashi, Jinko Chino no Kiso 1st edition, Saiensu-sha Co., Ltd. Nov. 10, 2008 (Nov. 10, 2008), pp. 165 to 179, Listed in International Search Report, 17 pages.
(Continued)

*Primary Examiner* — Bryan S Blankenagel
(74) *Attorney, Agent, or Firm* — Rankin, Hill & Clark LLP

(57) ABSTRACT

A dialog processing server is configured by including a relay unit which communicates with each of a first information processing terminal and a second information processing terminal, each serving as a portable or vehicle-mounted terminal and including an input/output interface unit with an artificial intelligence provided outside, and a determination unit which determines whether or not a predetermined dialog condition is established, in which between the artificial intelligence with which the first terminal communicates and the artificial intelligence with which the second terminal communicates, dialog contents respectively generated by the artificial intelligences can be transmitted and received when the dialog condition is established.

13 Claims, 30 Drawing Sheets

(51) Int. Cl.
   *G06F 16/9032*   (2019.01)
   *G06N 5/02*   (2006.01)

(56) References Cited

U.S. PATENT DOCUMENTS

| | | | | |
|---|---|---|---|---|
| 2014/0244744 | A1* | 8/2014 | Lyren | G06Q 50/01 709/204 |
| 2014/0355389 | A1* | 12/2014 | Reunamaki | H04W 4/21 367/197 |
| 2015/0186156 | A1* | 7/2015 | Brown | G06Q 10/10 715/706 |
| 2016/0071517 | A1* | 3/2016 | Beaver | G10L 15/22 704/9 |
| 2018/0005221 | A1* | 1/2018 | Lee | G06Q 20/4014 |

FOREIGN PATENT DOCUMENTS

| | | |
|---|---|---|
| JP | 2002-229795 | 8/2002 |
| JP | 2006-268597 | 10/2006 |
| JP | 2010-129033 | 6/2010 |
| JP | 2013-047972 | 3/2013 |
| JP | 2014-219594 | 11/2014 |
| JP | 2014-222517 | 11/2014 |

OTHER PUBLICATIONS

Written Opinion, 4 pages.
International Search Report, dated Mar. 14, 2017 (Mar. 14, 2017), 2 pages.
Japanese Office Action with English translation dated Aug. 18, 2020, 12 pages.
International Preliminary Report on Patentability dated Aug. 1, 2019, 7 pages.
Indian Office Action dated Mar. 2, 2021, 7 pages.

* cited by examiner

FIG.26
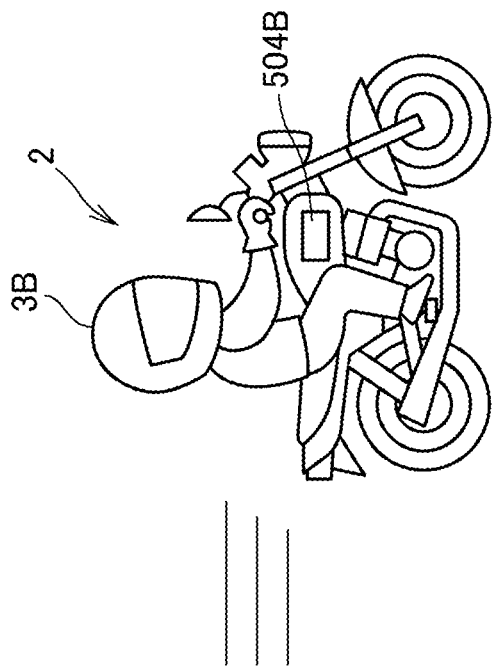
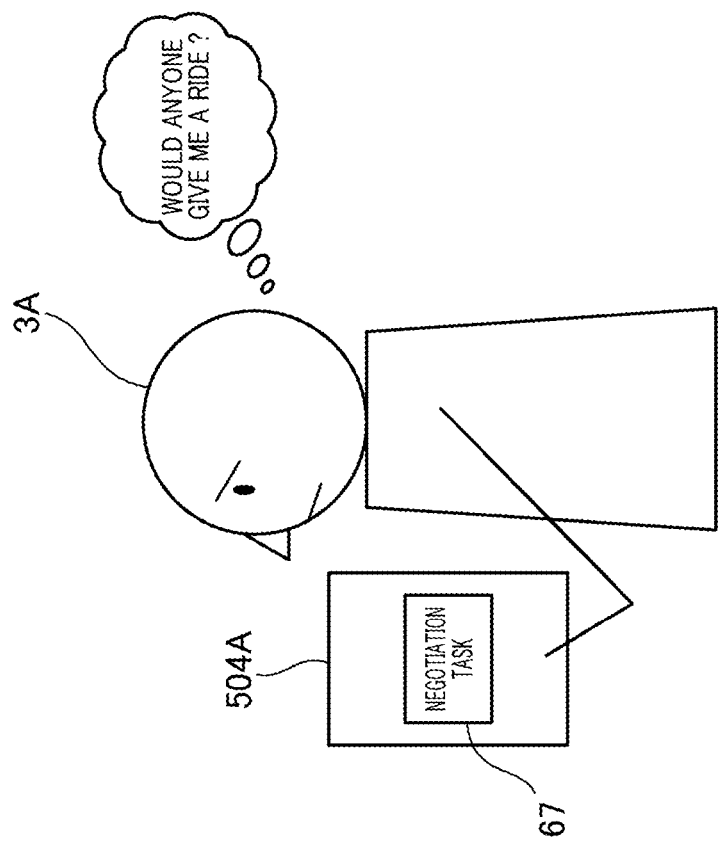

_US 11,107,471 B2_

DIALOG PROCESSING SERVER, CONTROL METHOD FOR DIALOG PROCESSING SERVER, AND TERMINAL

TECHNICAL FIELD

The present invention relates to a dialog processing server, a control method for the dialog processing server, and a terminal.

BACKGROUND ART

Conventionally, a system for a user to conduct a voice dialog with a terminal such as a smartphone has been known (see, e.g., Patent Literature 1). A technique for an artificial intelligence to emulate a temperament and a character of a human being and behave like a human being (see, e.g., Patent Literature 2) and a technique for changing a character of an artificial intelligence depending on storage of dialogs (see, e.g., Patent Literature 3) have also been known.

Further, a technique for a terminal to read a feeling of a user and to select a dialog to match the feeling has been known (see, e.g., Patent Literatures 4 and 5), and the technique has been expected to be loaded into an automobile (see, e.g., Patent Literature 5).

CITATION LIST

Patent Literature

[Patent Literature 1]
  Japanese Patent Laid-Open No. 2014-222517
[Patent Literature 2]
  Japanese Patent Laid-Open No. 2013-047972
[Patent Literature 3]
  Japanese Patent Laid-Open No. 2002-216026
[Patent Literature 4]
  Japanese Patent Laid-Open No. 2010-129033
[Patent Literature 5]
  Japanese Patent Laid-Open No. 2014-219594

SUMMARY OF INVENTION

Technical Problem

The techniques in all Patent Literatures disclose a voice dialog between a device and a user, and do not disclose that artificial intelligences conduct a dialog with each other.

The present invention is directed to providing a dialog processing server which implements a dialog between artificial intelligences, a control method for the dialog processing server, and a terminal.

Solution to Problem

An aspect of the present invention provides a dialog processing server (9) characterized by including means (47) for communicating with each of a first terminal (4A, 304A, 404A, 504A, 604A, 704A) and a second terminal (4B, 304B, 404B, 504B, 604B, 704B) each serving as a portable or vehicle-mounted terminal and including an input/output interface unit (30) with an artificial intelligence (35) provided outside, and means (45) for determining whether or not a predetermined dialog condition is established, in which between the artificial intelligence (35) with which the first terminal (4A, 304A, 404A, 504A, 604A, 704A) communicates and the artificial intelligence (35) with which the second terminal (4B, 304B, 404B, 504B, 604B, 704B) communicates, the dialog processing server (9) enables dialog contents (W) respectively generated by the artificial intelligences (35, 35) to be transmitted and received when the dialog condition is established.

According to the dialog processing server (9), the dialog contents (W) can be transmitted and received between the artificial intelligence (35) with which the first terminal (4A, 304A, 404A, 504A, 604A, 704A) communicates and the artificial intelligence (35) with which the second terminal (4B, 304B, 404B, 504B, 604B, 704B) communicates so that a dialog between the artificial intelligences (35, 35) is implemented.

Each of the first terminal (4A, 304A, 404A, 504A, 604A, 704A) and the second terminal (4B, 304B, 404B, 504B, 604B, 704B) need not search for the terminal as a partner in the dialog between the artificial intelligences (35, 35) by itself.

An aspect of the present invention provides a dialog processing server (9) characterized by including means (47) for communicating with each of a first terminal (104A) and a second terminal (104B) each serving as a portable or vehicle-mounted terminal and loaded with an artificial intelligence (35), and means (45) for determining whether or not a predetermined dialog condition is established, in which between the artificial intelligence (35) loaded into the first terminal (104A) and the artificial intelligence (35) loaded into the second terminal (104B), the dialog processing server (9) enables dialog contents (W) respectively generated by the artificial intelligences (35, 35) to be transmitted and received when the dialog condition is established.

The dialog processing server (9) also produces a similar effect to the effect produced by the above-described dialog processing server (9).

An aspect of the present invention provides a dialog processing server (9) characterized by including means (47) for communicating with each of a first terminal (104A) serving as a portable or vehicle-mounted terminal and loaded with an artificial intelligence (35) and a second terminal (4B, 304B, 404B, 504B, 604B, 704B) serving as a portable or vehicle-mounted terminal and including an input/output interface unit (30) with an artificial intelligence (35) provided outside, and means (45) for determining whether or not a predetermined dialog condition is established, in which between the artificial intelligence (35) loaded into the first terminal (104A) and the artificial intelligence (35) with which the second terminal (4B, 304B, 404B, 504B, 604B, 704B) communicates, the dialog processing server (9) enables dialog contents (W) respectively generated by the artificial intelligences (35, 35) to be transmitted and received when the dialog condition is established.

The dialog processing server (9) also produces a similar effect to the effect produced by the above-described dialog processing server (9).

The aspect of the present invention is characterized, in the above-described dialog processing server (9), in that the predetermined dialog condition includes a distance between the first terminal (4A, 104A, 304A, 404A, 504A, 604A, 704A) and the second terminal (4B, 104B, 304B, 404B, 504B, 604B, 704B).

According to the dialog processing server (9), when the first terminal (4A, 104A, 304A, 404A, 504A, 604A, 704A) and the second terminal (4B, 104B, 304B, 404B, 504B, 604B, 704B) are respectively positioned at distances appropriate for a dialog between the artificial intelligences (35, 35), the dialog can be conducted.

The aspect of the present invention is characterized, in the above-described dialog processing server (9), by further including means (47) for relaying the dialog contents (W) between the first terminal (4A, 104A, 404A, 504A, 604A, 704A) and the second terminal (4B, 104B, 404B, 504B, 604B, 704B).

According to the dialog processing server (9), when the dialog contents (W) are relayed, a reliability of transmission and reception of the dialog contents (W) between the artificial intelligences (35, 35) is enhanced.

The aspect of the present invention is characterized, in the above-described dialog processing server (9), in that the dialog contents (W) are respectively speeches when the artificial intelligences (35, 35) are chatting with each other.

According to the chat, users (3A) can respectively feel senses of affinity with the artificial intelligences (35, 35) and objectively grasp characters of the artificial intelligences (35, 35).

The aspect of the present invention is characterized, in the above-described dialog processing server (9), in that the chat includes a topic about a product associated with the first terminal (4A, 104A, 304A, 404A, 504A, 604A, 704A) and the second terminal (4B, 104B, 304B, 404B, 504B, 604B, 704B).

As a result, a material for determining purchase of the product is provided to the users (3A) via the chat.

The aspect of the present invention is characterized, in the above-described dialog processing server (9), in that each of the artificial intelligences (35, 35) learns information for promoting sales of the product until the product is purchased.

As a result, the longer a period elapsed until the product is purchased becomes, the larger an amount of the learning by each of the artificial intelligences (35, 35) becomes and the higher an added value of the product becomes. Accordingly, purchasing power of the product is supplemented.

The aspect of the present invention is characterized, in the above-described dialog processing server (9), in that the dialog contents (W) are respectively speeches relating to the topic previously set by the users (3A, 3B).

As a result, the users (3A, 3B) set a desired topic so that the users (3A, 3B) respectively enable the artificial intelligences (35, 35) to conduct a dialog about the topic instead of themselves. A communication between the users (3A, 3B) triggered by the dialog can also be established.

The aspect of the present invention is characterized, in the above-described dialog processing server (9), in that the topic includes a negotiation conducted between the artificial intelligences (35, 35).

As a result, the users (3A, 3B) can respectively entrust a negotiation having a content at which themselves are not good to the artificial intelligences (35, 35), and can also save time and effort to directly dialogue with each other. The users (3A, 3B) can determine whether or not each of the users (3A, 3B) himself or herself actually takes an action for a negotiation partner, respectively, based on contents of the dialog contents (W) between the artificial intelligences (35, 35) at the time of the negotiation.

The aspect of the present invention is characterized, in the above-described dialog processing server (9), in that when the negotiation is unsuccessfully completed between the artificial intelligences (35, 35), the dialog processing server (9) determines validity of the unsuccessful completion of the negotiation based on the dialog contents (W) transmitted and received in the negotiation, and the dialog processing server (9) instructs the first terminal (4A, 104A, 404A, 504A, 604A, 704A) or the second terminal (4B, 104B, 404B, 504B, 604B, 704B) as a partner in the negotiation to accept the negotiation when the dialog processing server (9) determines that the unsuccessful completion of the negotiation is not valid.

According to the dialog processing server (9), objective validity of the negotiation is maintained so that an unfair response of the partner can be prevented, for example.

An aspect of the present invention is characterized, in the above-described dialog processing server (9), in that the dialog contents (W) are respectively speeches including information previously permitted by the users (3A, 3B) among information (70) stored in the first terminal (4A, 104A, 304A, 404A, 504A, 604A, 704A) and the second terminal (4B, 104B, 304B, 404B, 504B, 604B, 704B).

As a result, the stored information (70) are respectively transmitted and received between the artificial intelligences (35, 35) via the dialog contents (W). Accordingly, the information (70) can be shared between the artificial intelligences (35, 35).

Only the information (70) respectively having contents previously permitted by the users (3A, 3B) are to be transmitted and received. Accordingly, information transmission against respective intentions of the users (3A, 3B) is prevented.

An aspect of the present invention provides a method for controlling a dialog processing server (9), characterized by including means (47) for communicating with each of a first terminal (4A, 304A, 404A, 504A, 604A, 704A) and a second terminal (4B, 304B, 404B, 504B, 604B, 704B) each serving as a portable or vehicle-mounted terminal and including an input/output interface unit (30) with an artificial intelligence (35) provided outside, the control method including a step of determining whether or not a predetermined dialog condition is established, and a step of enabling, between the artificial intelligence (35) with which the first terminal (4A, 304A, 404A, 504A, 604A, 704A) communicates and the artificial intelligence (35) with which the second terminal (4B, 304B, 404B, 504B, 604B, 704B) communicates, dialog contents respectively generated by the artificial intelligences (35, 35) to be transmitted and received when the dialog condition is established.

The control method produces a similar effect to the effect produced by the above-described dialog processing server (9).

An aspect of the present invention provides a method for controlling a dialog processing server (9), characterized by including means (47) for communicating with each of a first terminal (104A) and a second terminal (104B) each serving as a portable or vehicle-mounted terminal and loaded with an artificial intelligence (35), the control method including a step of determining whether or not a predetermined dialog condition is established, and a step of enabling, between the artificial intelligence (35) loaded into the first terminal (104A) and the artificial intelligence (35) loaded into the second terminal (104B), dialog contents (W) respectively generated by the artificial intelligences (35, 35) to be transmitted and received when the dialog condition is established.

The control method produces a similar effect to the effect produced by the above-described dialog processing server (9).

An aspect of the present invention provides a method for controlling a dialog processing server (9), characterized by including means (47) for communicating with each of a first terminal (104A) serving as a portable or vehicle-mounted terminal and loaded with an artificial intelligence (35) and a second terminal (4B, 304B, 404B, 504B, 604B, 704B)

serving as a portable or vehicle-mounted terminal and including an input/output interface unit (30) with an artificial intelligence (35) provided outside, the control method including a step of determining whether or not a predetermined dialog condition is established, and a step of enabling, between the artificial intelligence (35) loaded into the first terminal (104A) and the artificial intelligence (35) with which the second terminal (4B, 304B, 404B, 504B, 604B, 704B) communicates, dialog contents (W) respectively generated by the artificial intelligences (35, 35) to be transmitted and received when the dialog condition is established.

The control method produces a similar effect to the effect produced by the above-described dialog processing server (9).

An aspect of the present invention provides a portable or vehicle-mounted terminal (4A, 104A, 304A, 404A, 504A, 604A, 704A), characterized by including an input/output interface unit (30) with an artificial intelligence (35) provided outside, or an artificial intelligence (35), and means (12) for communicating with a dialog processing server (9) which determines whether or not a predetermined dialog condition is established, in which between the artificial intelligence (35) and the artificial intelligence (35) loaded into another terminal (4B, 104B, 304B, 404B, 504B, 604B, 704B), the portable or vehicle-mounted terminal (4A, 104A, 304A, 404A, 504A, 604A, 704A) transmits and receives dialog contents (W) respectively generated by the artificial intelligences (35, 35) when the dialog processing server (9) determines that the dialog condition is established.

The terminal (4A, 104A, 304A, 404A, 504A, 604A, 704A) produces a similar effect to the effect produced by the above-described dialog processing server (9).

Advantageous Effects of Invention

In the disclosure, the following functions and effects are exhibited.

That is, the disclosure discloses that dialog contents can be transmitted and received between an artificial intelligence with which a first terminal communicates and an artificial intelligence with which a second terminal communicates so that a dialog between the artificial intelligences is implemented.

It is disclosed that each of the first terminal and the second terminal need not search for a terminal as a partner in the dialog between the artificial intelligences by itself.

When the first terminal and the second terminal are respectively positioned at distances appropriate for the dialog between the artificial intelligences, the artificial intelligences can be made to dialog with each other.

It is disclosed that the dialog contents are relayed by a dialog processing server so that a reliability of transmission and reception of the dialog contents between the artificial intelligences is enhanced.

It is disclosed that by a chat between the artificial intelligences, users can respectively feel senses of affinity with the artificial intelligences and objectively grasp characters of the artificial intelligences.

It is disclosed that the chat includes a topic about a product associated with the first terminal and the second terminal so that a material for determining purchase of the product can be provided to the users via the chat.

It is disclosed that the longer a period elapsed until the product is purchased becomes, the larger an amount of learning by each of the artificial intelligences becomes and the higher an added value of the product becomes so that purchasing power of the product is supplemented.

It is disclosed that the users set a desired topic so that the users respectively enable the artificial intelligences to conduct a dialog about the topic instead of themselves.

It is disclosed that a communication between the users can be established, triggered by the dialog.

It is disclosed that the users can respectively entrust a negotiation having a content at which themselves are not good to the artificial intelligences, and can also save time and effort to directly dialogue with each other.

It is disclosed that the users can determine whether or not each of the users himself or herself actually takes an action for a negotiation partner, respectively, based on contents of the dialog contents between the artificial intelligences at the time of the negotiation.

It is disclosed that objective validity of the negotiation is maintained so that an unfair response of the partner can be prevented, for example.

It is disclosed that information can be shared between the artificial intelligences.

It is disclosed that only the information respectively having contents previously permitted by the users are transmitted and received so that information transmission against respective intensions of the users is prevented.

BRIEF DESCRIPTION OF DRAWINGS

FIG. 26 is a diagram illustrating a configuration of an AI-to-AI dialog system according to a modification 2D to the second application example.

DESCRIPTION OF EMBODIMENTS

Embodiments of the present invention will be described below with reference to the drawings.

First Embodiment

Figure 1:
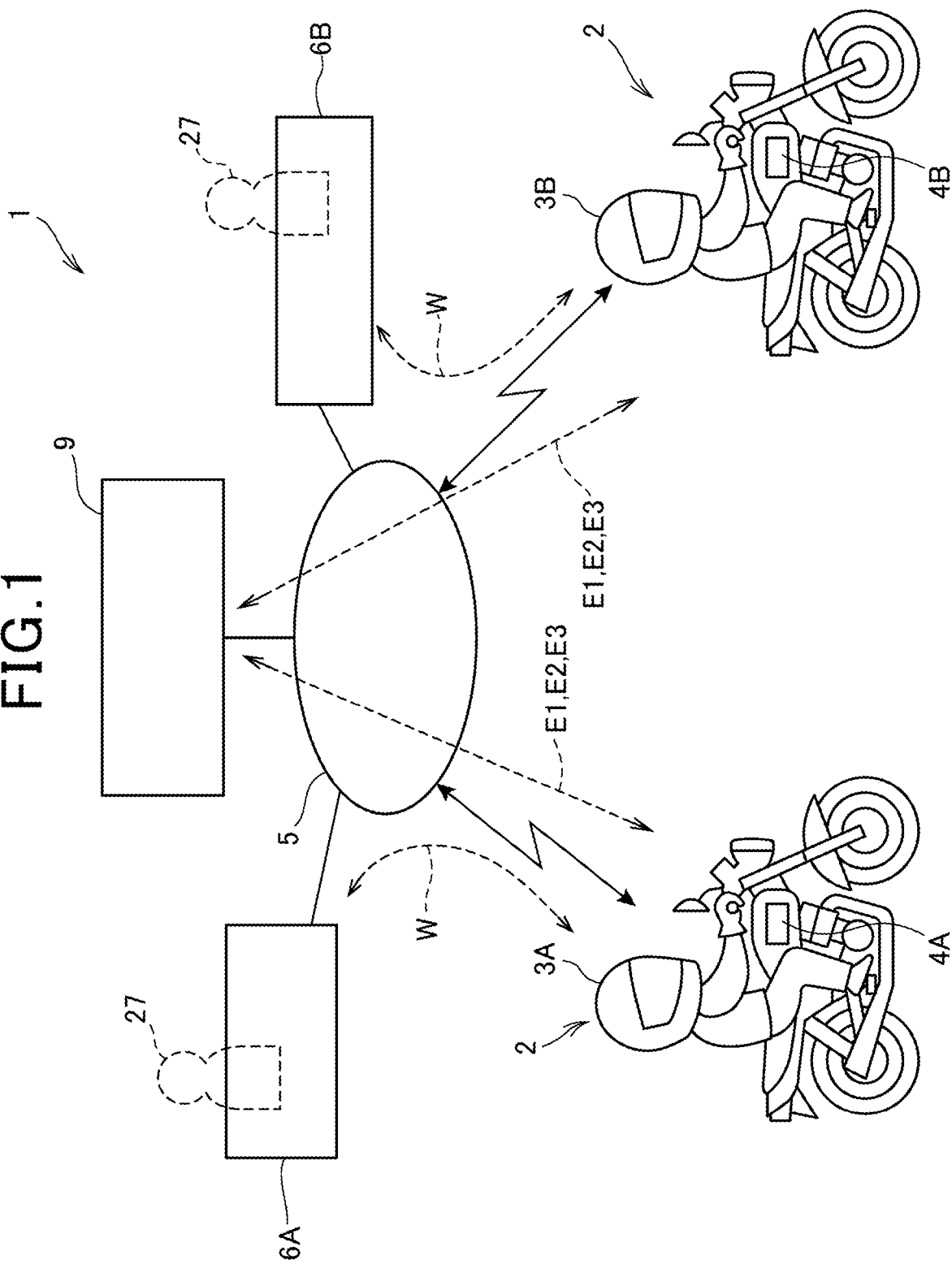
FIG. 1 is a diagram illustrating a configuration of an AI-to-AI dialog system according to a first embodiment of the present invention.

FIG. 1 is a diagram illustrating a configuration of an AI-to-AI dialog system 1 according to the present embodiment.

The AI-to-AI dialog system 1 includes a first information processing terminal 4A and a second information processing terminal 4B, a first AI server 6A and a second AI server 6B, and a dialog processing server 9, which are configured to be bidirectionally communicable via a communication line 5 such as the Internet.

The first AI server 6A and the second AI server 6B are respectively server computers which provide AI dialog services to the first information processing terminal 4A and the second information processing terminal 4B. The AI dialog service is a service which provides a dialog with a virtual human 27 implemented using an artificial intelligence (AI) technique. For the dialog, a natural language used for a dialog by a human being is used.

The first AI server 6A and the second AI server 6B respectively generate, when they acquire speeches of users 3A and 3B via the first information processing terminal 4A and the second information processing terminal 4B, response speeches of the virtual humans 27 to the speeches and output the generated speeches to the first information processing terminal 4A and the second information processing terminal 4B as dialog contents W. When the dialog contents W are respectively reproduced by the first information processing terminal 4A and the second information processing terminal 4B, the speeches of the virtual humans 27 are respectively notified to the users 3A and 3B.

As a result, the users 3A and 3B respectively enjoy dialogs with the virtual humans 27 as if they had the same sense as when they enjoy dialogs with actual human beings.

The first AI server 6A and the second AI server 6B in the present embodiment are respectively configured to accept something other than the speeches of the users 3A and 3B as input data Da (FIG. 3) and output the dialog contents W as responses to input of the input data Da.

Examples of the input data Da other than the speeches include image data obtained by shooting the users 3A and 3B and surroundings, various types of information about motorcycles 2 (including information about traveling), and surrounding environments (current positions, surrounding facilities, traffic information, weather, etc.) of the first information processing terminal 4A and the second information processing terminal 4B.

When the virtual humans 27 in the first AI server 6A and the second AI server 6B respectively generate dialog contents W for the input data Da, dialog contents W respectively corresponding to situations at that time, such as situations (expressions or gestures) of the users 3A and 3B, situations of the motorcycles 2, and surrounding situations at the time of traveling, can be outputted from the virtual humans 27 even if the users 3A and 3B do not speak. As a result, a presentation can be performed as if the virtual humans 27 spontaneously spoke.

The first information processing terminal 4A and the second information processing terminal 4B are respectively portable information processing terminals which can be carried by the users 3A and 3B or vehicle-mounted information processing terminals which are loaded into vehicles. The information processing terminal is a computer terminal having a general-purpose information processing function. Examples include a mobile phone terminal (including a so-called smartphone), a laptop computer, a portable music player, a navigation device, and a vehicle-mounted audio device.

The first information processing terminal 4A and the second information processing terminal 4B in the present embodiment are respectively configured as vehicle-mounted information processing terminals which are loaded into the motorcycles 2. The first information processing terminal 4A and the second information processing terminal 4B in the present embodiment are respectively configured such that the above-described AI dialog services provided by the first AI server 6A and the second AI server 6B are usable.

The dialog processing server 9 is a server computer which provides an AI-to-AI dialog service to the first information processing terminal 4A and the second information processing terminal 4B. The AI-to-AI dialog service is a service for respectively enabling the dialog contents W outputted by the virtual humans 27 in the first AI server 6A and the second AI server 6B to be transmitted and received via the first information processing terminal 4A and the second information processing terminal 4B to implement a dialog between the virtual humans 27.

Then, the first information processing terminal 4A and the second information processing terminal 4B will be described.

Note that since the respective configurations of the first information processing terminal 4A and the second information processing terminal 4B are the same, the first information processing terminal 4A out of them will be described.

Figure 2:
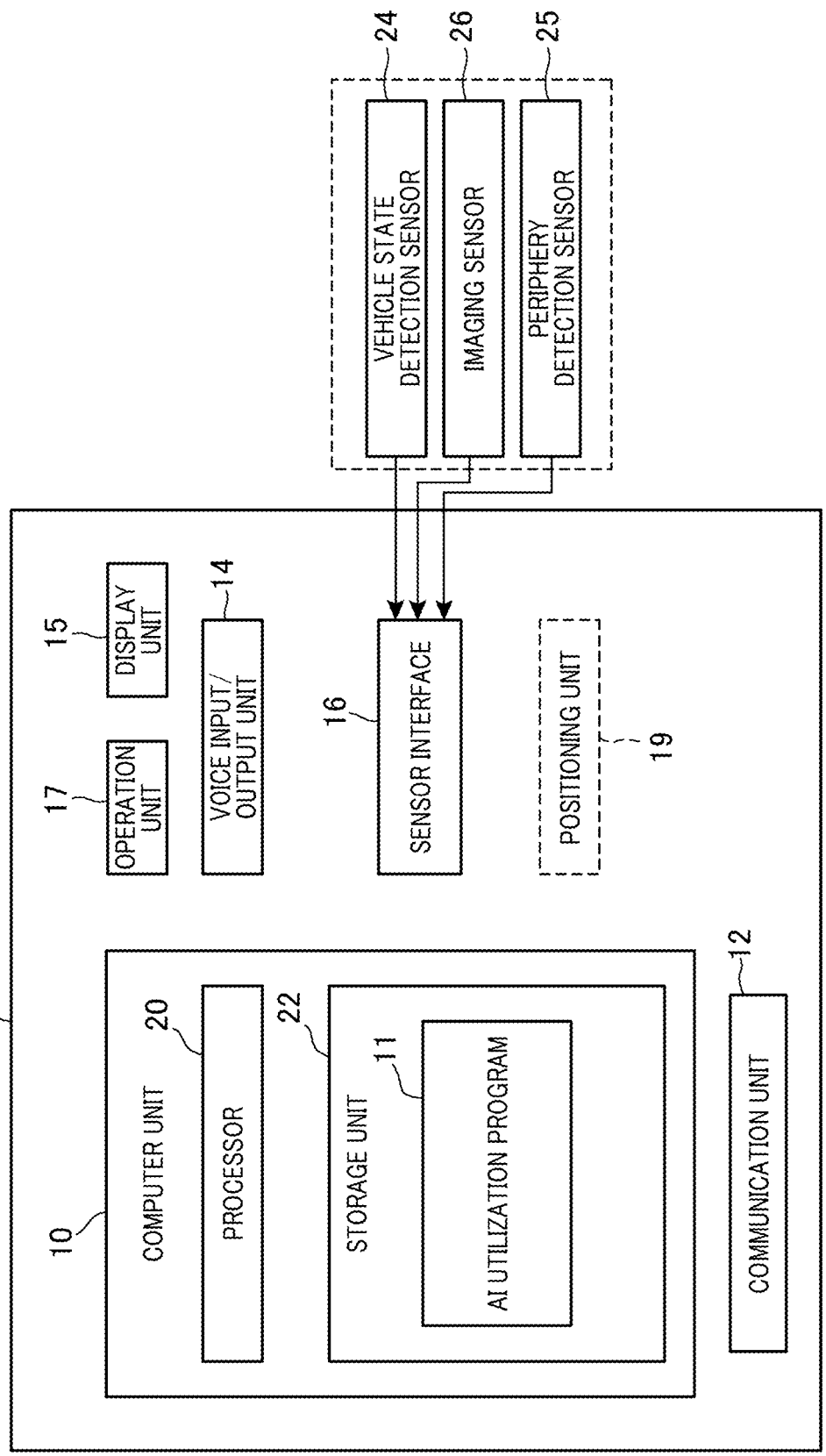
FIG. 2 is a diagram illustrating a hardware configuration of a first information processing terminal.

FIG. 2 is a diagram illustrating a hardware configuration of the first information processing terminal 4A.

The first information processing terminal 4A includes a computer unit 10 which executes a computer program to implement various types of functions, a communication unit 12, an operation unit 17, a display unit 15, a voice input/output unit 14, and a sensor interface 16.

The computer unit 10 includes a processor 20 which executes the computer program and a storage unit 22 including a main memory and an auxiliary storage device. The storage unit 22 stores the computer program and various types of data, and is also used as a work area of the processor 20.

Examples of the storage unit 22 which is used include a nonvolatile random access memory (RAM) and/or a read-only memory (ROM).

Examples of the processor 20 which is used include an integrated circuit, a microcontroller, a microcomputer, a programmable logic controller, an application specific integrated circuit, and other programmable circuits.

A so-called SoC (System-on-a-Chip) device can also be used as the computer unit 10.

The communication unit 12 is a network interface configured or designed to use various network communication protocols.

In the present embodiment, the communication unit 12 communicates with the first AI server 6A and the dialog processing server 9 via the communication line 5.

The operation unit 17 includes a plurality of operators which accept various types of operations of the user 3A, an owner, and the like and outputs respective operations for the operators to the computer unit 10.

The display unit 15 displays various types of information, and includes a flat panel display, for example.

Note that when a vehicle body of the motorcycle 2 includes an operation unit and a display unit, the first information processing terminal 4A can also use the operation unit and the display unit.

The voice input/output unit 14 captures a voice uttered by the user 3A and outputs the uttered voice to the computer unit 10, and outputs a voice to outside based on voice data generated by the computer unit 10.

The voice input/output unit 14 includes, to implement a function of capturing a voice, a microphone for capturing the voice, and an encoder circuit which encodes an analog voice signal outputted by the microphone into a digital voice signal. The voice input/output unit 14 includes, to implement a function of outputting a voice, a decoder circuit which decodes a digital voice signal outputted by the computer unit 10 and converts the decoded digital voice signal into an analog voice signal, and a speaker which emits a voice based on the analog voice signal. Note that the voice input/output unit 14 may receive input of the analog voice signal from the microphone provided in the motorcycle 2 and emit the analog voice signal via the speaker provided in the motorcycle 2.

As described above, the first AI server 6A and the second AI server 6B in the present embodiment are configured to enable input, as the input data Da other than the speeches, image data obtained by shooting the users 3A and 3B and surroundings, various types of information about the motorcycles 2 (including information about traveling), and surrounding environments (current positions, surrounding facilities, traffic information, weather, etc.) of the first information processing terminal 4A and the second information processing terminal 4B.

The sensor interface 16 is an interface which makes various types of sensors connectable to collect information other than the speeches. Examples of the types of sensors include various types of vehicle-mounted sensors provided in the motorcycle 2. In the present embodiment, the vehicle-mounted sensors include a vehicle state detection sensor 24 which detects a vehicle state and a traveling state of the motorcycle 2 and an imaging sensor 26 for detecting a behavior of a driver.

Examples of the vehicle state detection sensor 24 include vehicle-mounted sensors generally provided in the motorcycle 2, such as a vehicle speed sensor, a fuel sensor, a water temperature sensor, an $O_2$ sensor, and an inclination sensor. Other examples include various types of sensors (i.e., various types of sensors each of which outputs a signal to an ECU loaded into the motorcycle 2) used for electronic control of the motorcycle 2.

Further, the motorcycle 2 loaded with the first information processing terminal 4A is loaded with a periphery detection sensor 25 which detects presence or absence of a vehicle or a human being therearound, and an output of the periphery detection sensor 25 is also inputted to the sensor interface 16. The periphery detection sensor 25 is a device which detects the presence or absence of the vehicle or the human being therearound using a sensing technique by an electric wave, infrared rays, or a laser or a sensing technique by image processing.

The imaging sensor 26 is a sensor which shoots the driver to detect the behavior of the driver. Note that if a vehicle-mounted sensor which detects a driving operation of the driver is included in the vehicle state detection sensor 24, an output of the vehicle-mounted sensor is also used to detect the behavior of the driver. Examples of this type of vehicle-mounted sensor include a throttle position sensor which detects an opening of a throttle valve and a sensor which detects an operation of a front brake lever.

Note that the first information processing terminal 4A may include respective parts of the vehicle state detection sensor 24 and the imaging sensor 26.

An output of a positioning sensor such as an accelerometer or a GPS is also inputted to the sensor interface 16 in addition thereto. If the motorcycle 2 includes a navigation device, the first information processing terminal 4A may acquire position information of an own vehicle from the navigation device. The first information processing terminal 4A may include a positioning unit 19 including a positioning sensor. Further, the first information processing terminal 4A may have a function of the navigation device.

Figure 3:
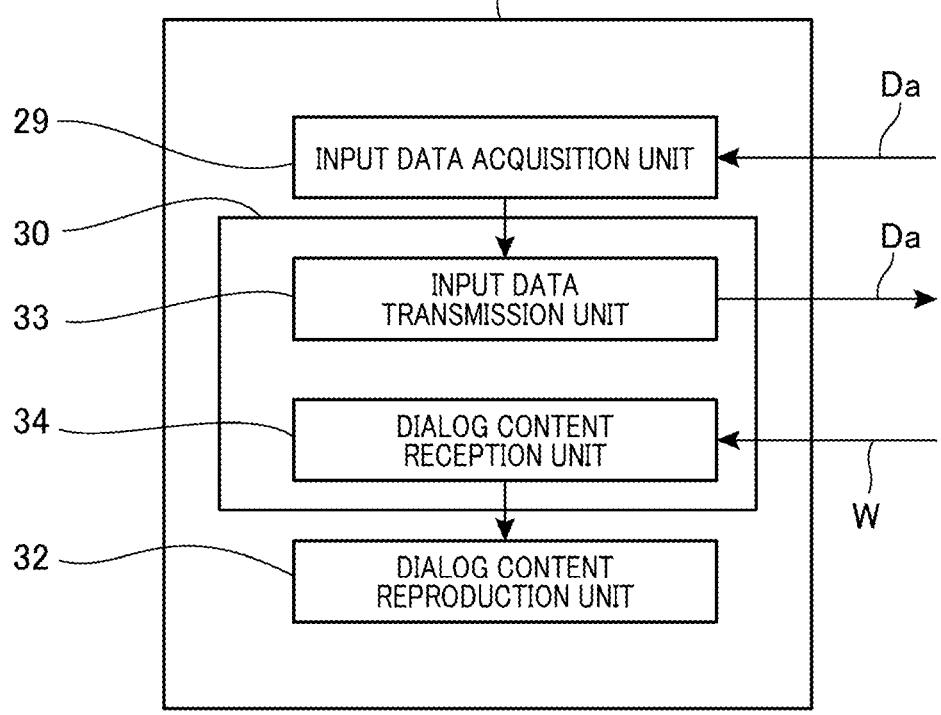
FIG. 3 is a block diagram illustrating a functional configuration of the first information processing terminal.

FIG. 3 is a block diagram illustrating a functional configuration of the first information processing terminal 4A.

The storage unit 22 illustrated in FIG. 2 mentioned above stores an AI utilization program 11 as a computer program for using the above-described AI dialog service provided by the first AI server 6A. When the processor 20 executes the AI utilization program 11, a functional block illustrated in FIG. 3 is implemented.

That is, the first information processing terminal 4A includes an input data acquisition unit 29, an AI interface unit 30, and a dialog content reproduction unit 32, as illustrated in FIG. 3.

The input data acquisition unit 29 acquires input data Da to be inputted to the first AI server 6A to conduct a dialog with the virtual human 27.

Examples of the input data Da include a speech of the user 3A inputted from the voice input/output unit 14, an operation input inputted from the operation unit 17, and various types of signals (shooting data, respective detection signals of various types of vehicle-mounted sensors, etc.) inputted via the sensor interface 16, as described above.

The AI interface unit 30 serves a function of a data input/output interface with the first AI server 6A, and includes an input data transmission unit 33 and a dialog content reception unit 34. The input data transmission unit 33 transmits the input data Da to the first AI server 6A via the communication line 5. The dialog content reception unit 34 receives the dialog content W outputted by the virtual human 27 as a response to the input data Da from the first AI server 6A via the communication line 5.

The dialog content reproduction unit 32 outputs the dialog content W as a voice from the voice input/output unit 14 and/or displays the dialog content W on the display unit 15 to reproduce the voice. Respective presentations for lighting up meters in the motorcycle 2 and producing a sound, for example, may be combined depending on a content of the dialog content W.

Then, the first AI server 6A and the second AI server 6B will be described in detail.

Note that since respective configurations of the first AI server 6A and the second AI server 6B are the same, the first AI server 6A out of them will be described in detail.

Figure 4:
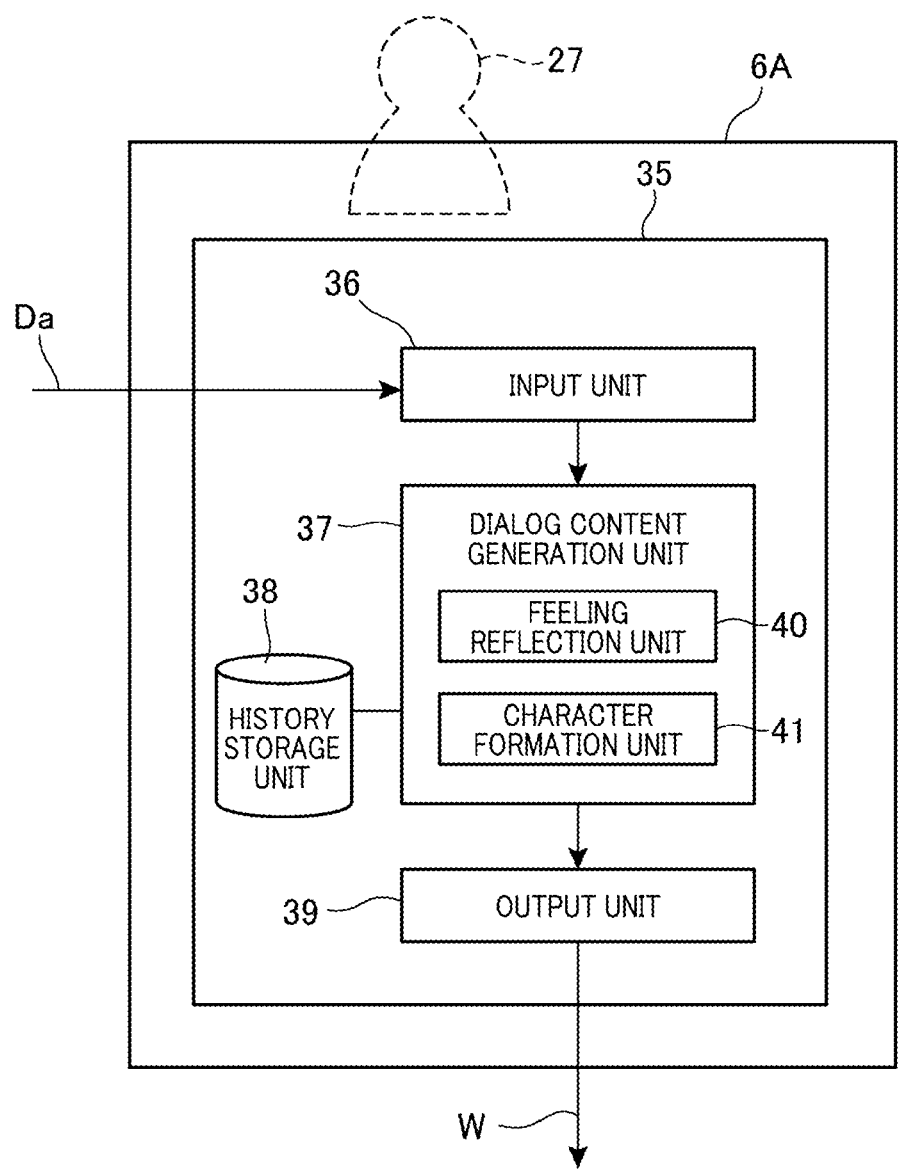
FIG. 4 is a diagram illustrating a functional configuration of a first AI server.

FIG. 4 is a diagram illustrating a functional configuration of the first AI server 6A.

The first AI server 6A is composed of a server computer, as described above, and includes an AI unit 35, as illustrated in FIG. 4. The AI unit 35 is a functional unit which implements the above-described virtual human 27 which conducts a dialog with the user 3A, and includes an input unit 36, a dialog content generation unit 37, a history storage unit 38, and an output unit 39.

The input unit 36 receives the input data Da transmitted from the first information processing terminal 4A, and outputs the received input data Da to the dialog content generation unit 37.

The dialog content generation unit 37 is an artificial intelligence which generates a content of a dialog responding to input of the input data Da.

The artificial intelligence includes one or more element techniques such as various types of filtering, independent component analysis, an SVM (support vector machine), an image processing technique such as contour extraction, pattern recognition (e.g., voice recognition and face recognition), natural language processing, knowledge information processing, reinforcement learning, a bayesian network, an SOM (self-organizing map), a neutral network, deep learning, and various other types of machine learning.

The neural network and the machine learning are used for the artificial intelligence as the dialog content generation unit 37 in the present embodiment. That is, the neural network is previously subjected to the machine learning such that a dialog content W is generated, when various types of input data Da are inputted, as a response to the input data Da.

The dialog content generation unit 37 in the present embodiment has a function of generating a dialog content on which a feeling of the user 3A is reflected and a function of characterizing the virtual human 27 to make a dialog have individuality, and includes a feeling reflection unit 40 and a character formation unit 41 to implement the functions.

The feeling reflection unit 40 estimates the feeling of the user 3A based on the input data Da.

In the present embodiment, an artificial intelligence is also used for feeling estimation processing in the feeling reflection unit 40. The neural network and the machine learning are also used for the artificial intelligence. The feeling reflection unit 40 estimates the feeling according to a feeling estimation algorithm obtained by the machine learning for the neural network.

Supervised learning, for example, can be used as the machine learning in thee feeling reflection unit 40.

In the supervised learning, a correct answer is previously set for learning data for learning. The neural network changes a bond strength of a synaptic connection for connecting its own nodes to output the correct answer when the learning data is inputted, to learn the correct answer. Note that an input/output rule of the neural network obtained as a result of the learning is an algorithm for associating input data with output data. The algorithm obtained by the learning can be coded into a computer program.

In the supervised learning for obtaining the feeling estimation algorithm, a voice, an expression, and a behavior (gesture) of a dialog partner can be used for the learning data. A type of a feeling of the dialog partner and a strength of the feeling are used for the correct answer at this time. Examples of the type of the feeling which can be used include "joy", "anger", "sadness", "pleasure", "impatience", "anxiety", and "neutral".

By the supervised machine learning using the learning data, a feeling estimation algorithm for outputting a feeling of a dialog partner and a strength of the feeling to input of the voice, the expression, and the behavior of the dialog partner is obtained.

Note that the type of the feeling is merely illustrative, and may be appropriately changed if necessary. For the feeling reflection unit 40, any existing feeling recognition technique can also be used instead of the above-described feeling estimation algorithm.

The character formation unit 41 makes a tendency of the dialog content W outputted by the AI unit 35 have a deviation corresponding to a character of a human being to make the virtual human 27 have individuality.

In the present embodiment, the individuality of the virtual human 27 is modeled by a set of a plurality of character factors such as "active", "talkative", "devoted", and "easy-going", and individuality is formed by weighting of each of the character factors. The weighting of each of the character factors is set at the time of factory shipping, for example.

In the dialog content generation unit 37, when the dialog content W is generated, the feeling of the user 3A is first estimated by the feeling reflection unit 40, and a dialog content W on which the feeling and the individuality set in the character formation unit 41 are reflected is generated.

Further, the dialog content generation unit 37 in the present embodiment learns a history of a relationship with the user 3A and more specifically a reaction of the user 3A to the dialog content W so that a dialog content W suited to a personality of the user 3A is generated.

So-called reinforcement learning can be used as the learning of the dialog content generation unit 37.

The reinforcement learning is to subject the neural network to machine learning such that a more desirable output is obtained regardless of learning data. That is, in the reinforcement learning, a reward (a degree of a desirable result) obtained by output of the neural network is previously set, and the neural network changes, when it provides an output for input of the learning data, the bond strength of the synaptic connection for connecting the nodes of the neural network such that the reward for the output becomes higher.

In the reinforcement learning of the dialog content generation unit 37, a dialog content W outputted to a dialog partner and a change in the feeling of the dialog partner before and after the output of the dialog content W can be used for the learning data.

A desirable change manner in the change in the feeling of the dialog partner is defined in the reward.

The dialog content generation unit 37 acquires, every time it outputs the dialog content W, the change in the feeling of the dialog partner before and after the output of the dialog content W based on the input data Da, and subjects the neural network to reinforcement learning based on the dialog content W and the change in the feeling of the dialog partner.

In the reinforcement learning, the dialog content generation unit 37 changes the weighting of the character factor set in the character formation unit 41 when the reward increases.

As a result, even if the personality of the user 3A is optional, and it is unclear about what dialog content W the user 3A feels and how the user 3A feels about the dialog content W, the dialog generation algorithm 13 is changed by the learning such that the dialog content W suited to the user 3A is outputted. When the weighting of the character factor set in the character formation unit 41 is changed if necessary, the character of the AI unit 35 is changed to a character compatible with the character of the user 3A.

Note that in the reinforcement learning of the dialog content generation unit 37, other reactions (a speech, a change in expression, a gesture, a change of a driving operation state of the motorcycle 2, etc.) of the dialog partner to the dialog content W can also be used in place of or in addition to the change in feeling of the dialog partner before and after the output of the dialog content W for the learning data.

The weighting of the character factor set in the character formation unit 41 may be changeable by the user 3A.

The history storage unit 38 illustrated in FIG. 4 sequentially stores a behavior history of the user 3A and an operation history of the motorcycle 2 (a traveling history and detection information of meters and sensors). The behavior history of the user 3A includes a change in feeling before and after the output of the dialog content W and a reaction to the dialog content W. The histories stored in the history storage unit 38 are referred to when the dialog content generation unit 37 performs the above-described machine learning and generates the dialog content W.

As a result, the dialog content W on which the user 3A and the motorcycle 2 are reflected is generated.

The output unit 39 transmits the dialog content W to the first information processing terminal 4A.

Then, the dialog processing server 9 will be described in detail.

Figure 5:
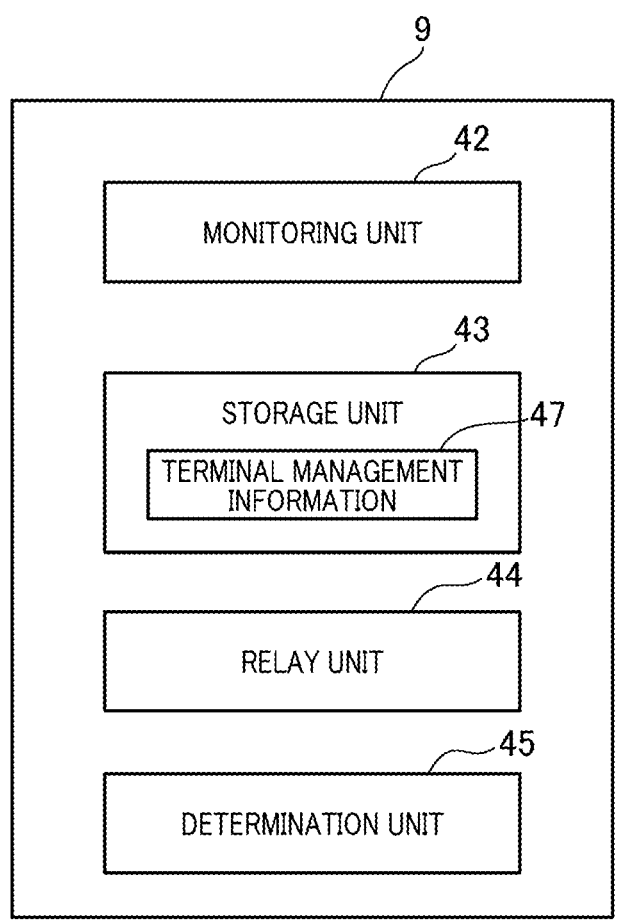
FIG. 5 is a diagram illustrating a functional configuration of a dialog processing server.

FIG. 5 is a diagram illustrating a functional configuration of the dialog processing server 9.

The dialog processing server 9 is composed of a server computer, as described above, and provides an AI-to-AI dialog service for enabling a dialog between the respective virtual humans 27 in the first AI server 6A and the second AI server 6B to the first information processing terminal 4A and the second information processing terminal 4B.

The dialog processing server 9 is configured such that the dialog between the virtual humans 27 is conducted between the first information processing terminal 4A and the second information processing terminal 4B which satisfy a predetermined condition.

In the present embodiment, the predetermined condition is that a distance between the first information processing terminal 4A and the second information processing terminal 4B is a predetermined distance or less.

The dialog processing server 9 includes a monitoring unit 42, a storage unit 43, a relay unit 44, and a determination unit 45, as illustrated in FIG. 5. Each of the units in the dialog processing server 9 is implemented when the server computer executes a predetermined computer program.

The monitoring unit 42 monitors respective positions of the first information processing terminal 4A and the second information processing terminal 4B. In the present embodiment, each of the first information processing terminal 4A and the second information processing terminal 4B periodically transmits a first signal E1 (see FIG. 1) including its own device ID and position information to the dialog processing server 9. Note that the dialog processing server 9 may periodically transmit a signal for confirming the position information to each of the first information processing terminal 4A and the second information processing terminal 4B.

The storage unit 43 stores terminal management information 47. The terminal management information 47 is information including the respective device IDs and position information of the first information processing terminal 4A and the second information processing terminal 4B, and is sequentially updated based on the first signals E1. Note that the terminal management information 47 may include any other information such as information about the motorcycle 2 and information about the users 3A and 3B.

The relay unit 44 relays the dialog contents W between the first information processing terminal 4A and the second information processing terminal 4B. More specifically, when the first information processing terminal 4A and the second information processing terminal 4B transmit and receive the dialog contents W to and from each other, each of them transmits a second signal E2 (see FIG. 1) including its own device ID and a device ID of a dialog partner to the dialog processing server 9.

The relay unit 44 specifies, when it receives the second signal E2, the first information processing terminal 4A or the second information processing terminal 4B as the dialog partner based on the device ID of the dialog partner, to transmit the second signal E2.

The determination unit 45 determines whether or not the above-described predetermined condition as a condition for enabling a dialog between the virtual humans 27 between the first information processing terminal 4A and the second information processing terminal 4B is established. In the present embodiment, the predetermined condition is a distance between the first information processing terminal 4A and the second information processing terminal 4B, as described above. That is, the determination unit 45 specifies the first information processing terminal 4A and the second information processing terminal 4B which are a predetermined distance or less away from each other based on the terminal management information 47, and transmits dialog enable signals E3, respectively, to the first information processing terminal 4A and the second information processing terminal 4B.

The dialog enable signals E3 respectively include the device IDs of the first information processing terminal 4A and the second information processing terminal 4B. Each of the first information processing terminal 4A and the second information processing terminal 4B can specify the device ID of the partner by receiving the dialog enable signal E3. When the first information processing terminal 4A and the second information processing terminal 4B transmit and receive the respective dialog contents W from the virtual humans 27 to and from each other, each of them transmits the second signal E2, including the dialog content W and the device ID of the partner, to the dialog processing server 9. As a result, each of the dialog contents W is relayed to the partner by the dialog processing server 9, so that a dialog is conducted between the first information processing terminal 4A and the second information processing terminal 4B.

Figure 6:
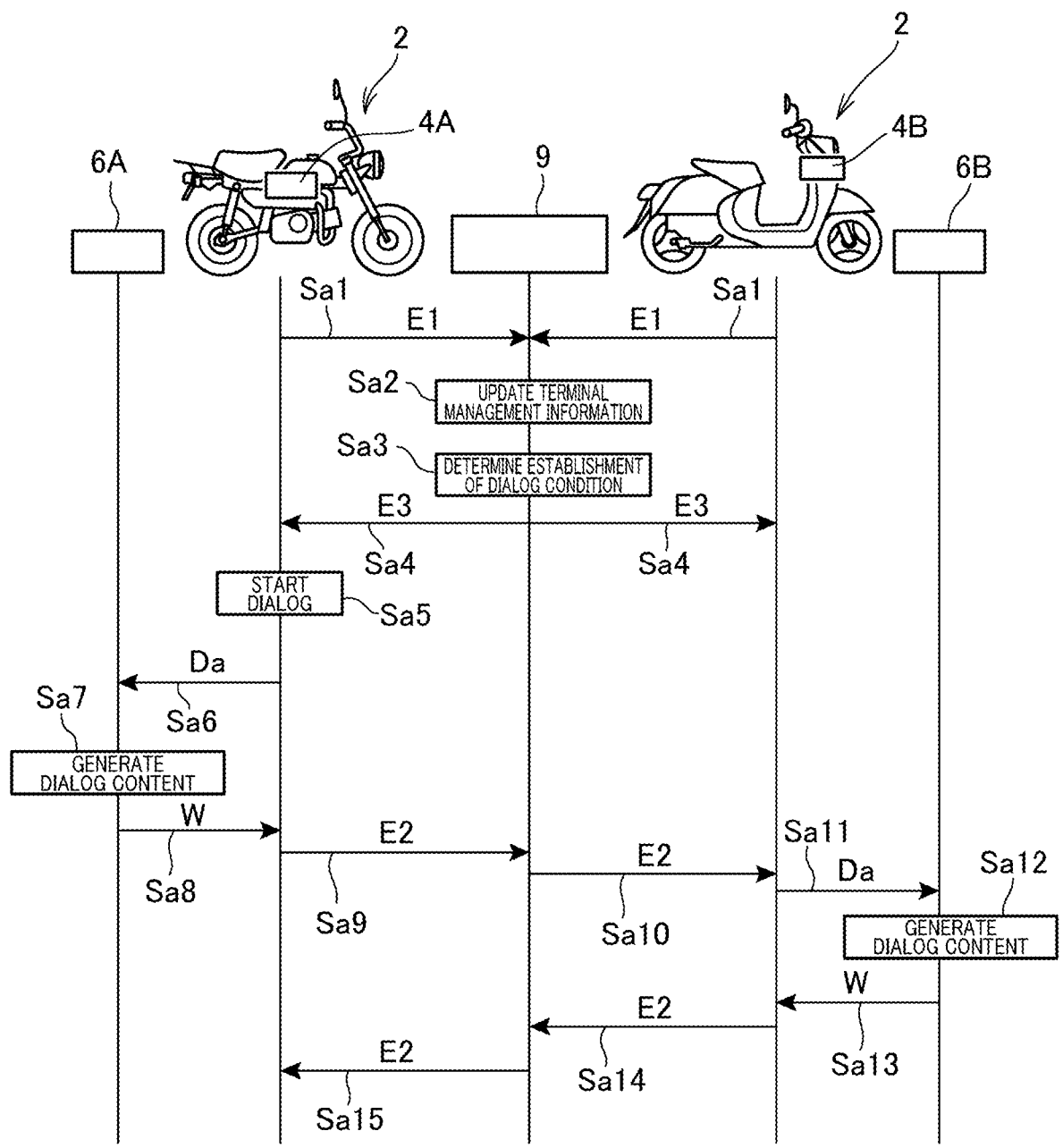
FIG. 6 is a sequence diagram of the AI-to-AI dialog system.

FIG. 6 is a sequence diagram of the AI-to-AI dialog system 1.

The first information processing terminal 4A and the second information processing terminal 4B respectively intermittently transmit the above-described first signals E1 including the device IDs and the position information to the dialog processing server 9 (step Sa1).

The dialog processing server 9 updates, when it receives the first signals E1, the terminal management information 47 based on the information (the devices ID and the position information) included in the first signals E1 (step Sa2).

The dialog processing server 9 determines whether or not a dialog condition is established based on the terminal management information 47 (step Sa3). That is, the dialog processing server 9 determines whether or not a distance between the first information processing terminal 4A and the second information processing terminal 4B is a predetermined distance or less. If the distance between the first information processing terminal 4A and the second information processing terminal 4B is the predetermined distance or less, the dialog processing server 9 transmits dialog enable signals E3, respectively, to the first information processing terminal 4A and the second information processing terminal 4B (step Sa4). Each of the first information processing terminal 4A and the second information processing terminal 4B can specify a device ID of a partner to and from whom it can transmit and receive the dialog content W by receiving the dialog enable signal E3.

When the first information processing terminal 4A, for example, starts a dialog with the second information processing terminal 4B (step Sa5), the first information processing terminal 4A transmits input data Da to the first AI server 6A (step Sa6). The first AI server 6A generates, when it receives the input data Da, a dialog content W based on the input data Da (step Sa7), and transmits the dialog content W to the first information processing terminal 4A (step Sa8).

The first information processing terminal 4A transmits, when it receives the dialog content W from the first AI server 6A, the above-described second signal E2 including the dialog content W and the device ID of the partner to the dialog processing server 9 to deliver the dialog content W to the partner (step Sa9).

The dialog processing server 9 specifies, when it receives the second signal E2, the second information processing terminal 4B based on the device ID of the dialog partner included in the second signal E2, and transmits the second signal E2 to the second information processing terminal 4B (step Sa10).

The second information processing terminal 4B transmits, when it receives the second signal E2 from the dialog processing server 9, input data Da, including the dialog content W from the first AI server 6A, to the second AI server 6B (step Sa11).

The second AI server 6B generates, when it receives the input data Da, a dialog content W of a response to the dialog content W from the first AI server 6A (step Sa12), and transmits the dialog content W to the second information processing terminal 4B (step Sa13).

The second information processing terminal 4B transmits, when it receives the dialog content W from the second AI server 6B, the second signal E2 including the dialog content W and the device ID of the partner to the dialog processing server 9 to deliver the dialog content W to the partner (step Sa14).

The dialog processing server 9 specifies the first information processing terminal 4A based on the device ID of the dialog partner included in the second signal E2, and transmits the second signal E2 to the first information processing terminal 4A (step Sa15).

Through a series of operations, the respective dialog contents W from the first AI server 6A and the second AI server 6B are respectively transmitted and received via the first information processing terminal 4A and the second information processing terminal 4B, so that a dialog is conducted between the first AI server 6A and the second AI server 6B.

The first information processing terminal 4A and the second information processing terminal 4B respectively output the dialog contents W to be transmitted and received by voices or the like. As a result, the users 3A and 3B can enjoy a dialog between the virtual humans 27.

According to the present embodiment, the following effect is produced.

That is, in the present embodiment, the dialog processing server 9 determines whether or not the dialog condition is established, to enable the dialog contents W to be transmitted and received between the first information processing terminal 4A and the second information processing terminal 4B when the dialog condition has been established.

As a result, the dialog contents W are transmitted and received between the AI unit 35 (the virtual human 27) in the first AI server 6A with which the first information processing terminal 4A communicates and the AI unit 35 (the virtual human 27) in the second AI server 6B with which the second information processing terminal 4B communicates, so that a dialog between the AI units 35 (the virtual humans 27) can be conducted.

Each of the first information processing terminal 4A and the second information processing terminal 4B need not search for the terminal as the partner in the dialog between AIs by itself.

In the present embodiment, the dialog processing server 9 determines a distance between the first information processing terminal 4A and the second information processing terminal 4B as a predetermined dialog condition.

As a result, when the first information processing terminal 4A and the second information processing terminal 4B are positioned a distance appropriate for the dialog between the AIs away from each other, the dialog can be conducted.

According to the present embodiment, the dialog processing server 9 relays the dialog contents W between the first information processing terminal 4A and the second information processing terminal 4B, thereby enhancing a reliability of transmission and reception of the dialog contents W between the AI units 35 respectively corresponding thereto.

Second Embodiment

In description of the present embodiment, members described in the first embodiment are assigned the same reference numerals, and description thereof is omitted.

Figure 7:
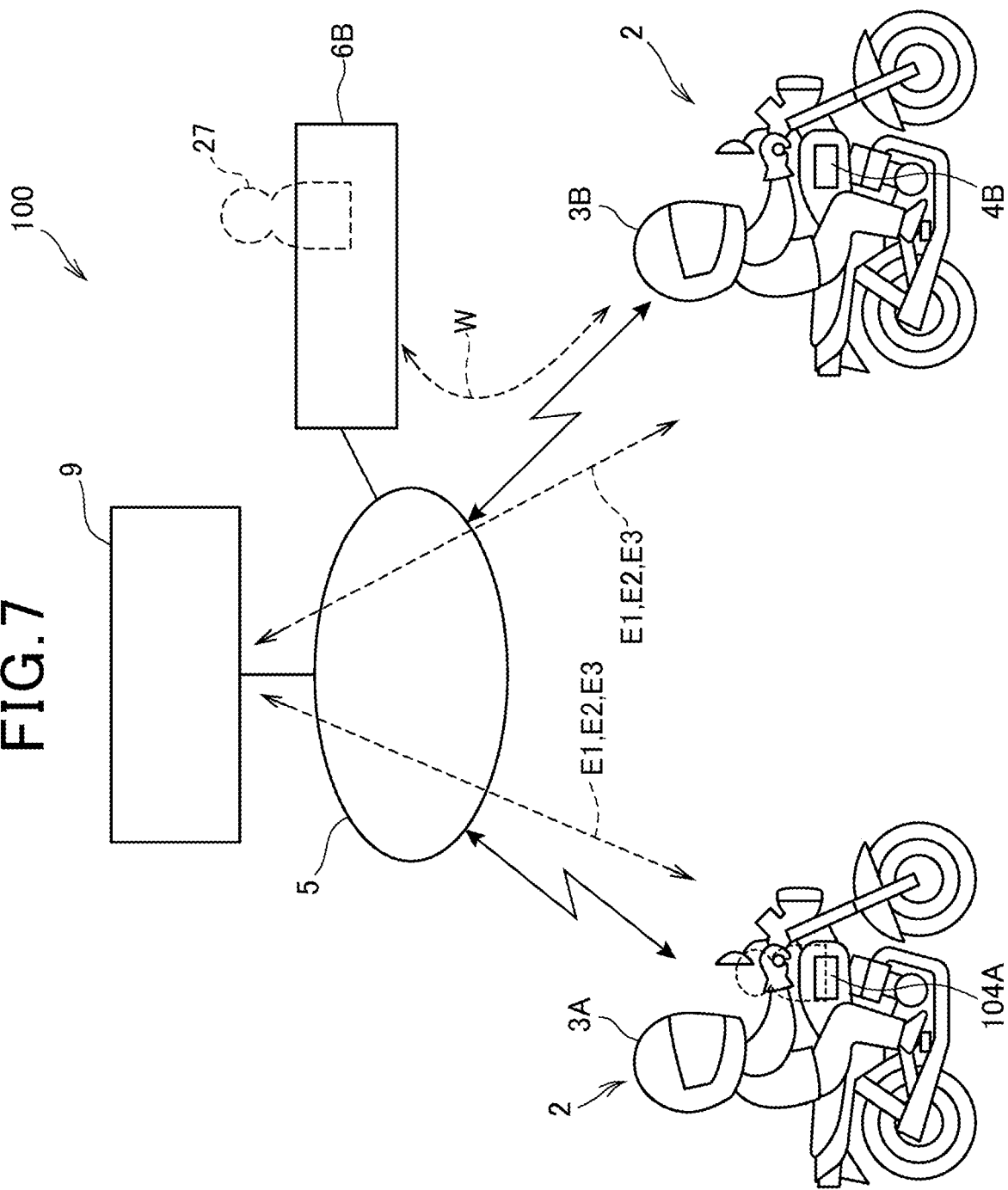
FIG. 7 is a diagram illustrating a configuration of an AI-to-AI dialog system according to a second embodiment of the present invention.

FIG. 7 is a diagram illustrating a configuration of an AI-to-AI dialog system 100 according to a second embodiment of the present invention.

As illustrated in FIG. 7, the AI-to-AI dialog system 100 differs in configuration from the AI-to-AI dialog system 1 according to the first embodiment in that a first information processing terminal 104A has a function of a virtual human 27 by including an AI unit 35.

Figure 8:
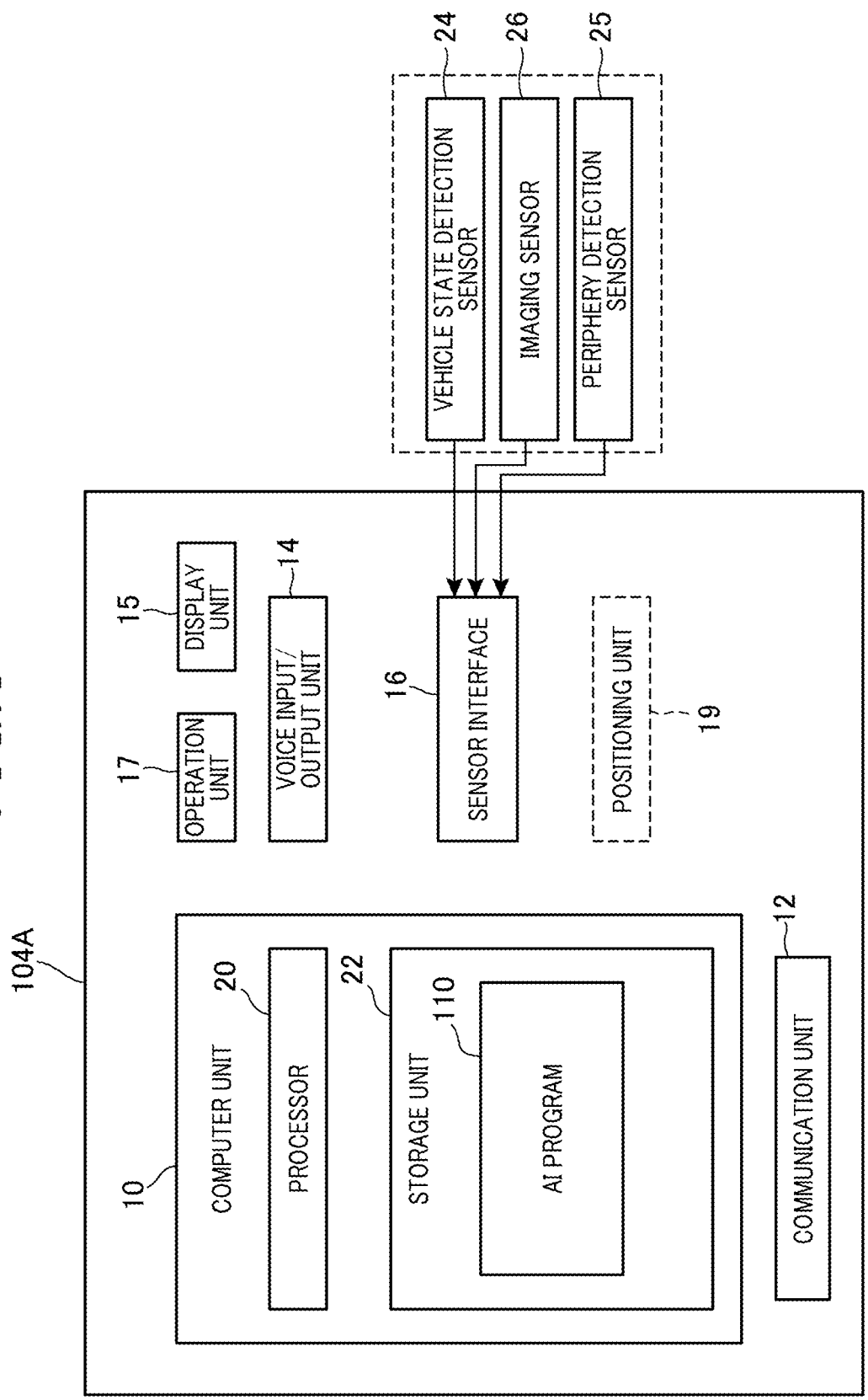
FIG. 8 is a diagram illustrating a hardware configuration of a first information processing terminal according to the second embodiment.
Figure 9:
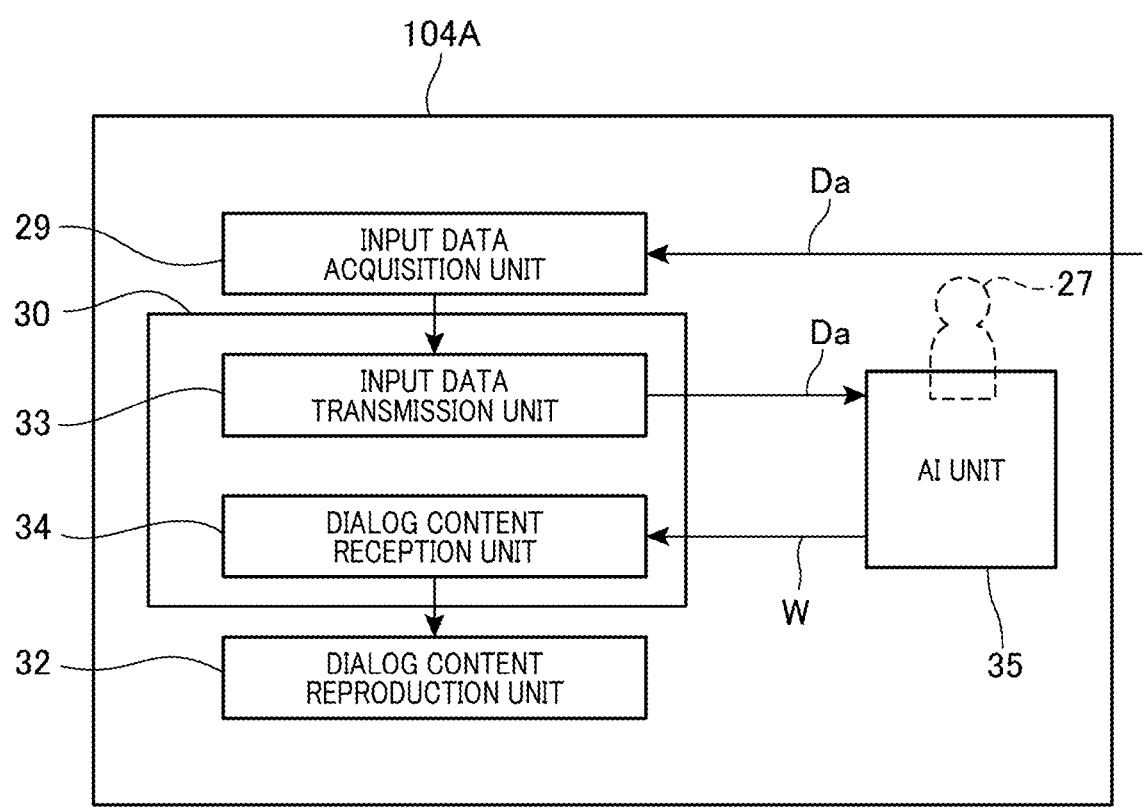
FIG. 9 is a block diagram illustrating a functional configuration of the first information processing terminal according to the second embodiment.

FIG. 8 is a diagram illustrating a hardware configuration of the first information processing terminal 104A, and FIG. 9 is a block diagram illustrating a functional configuration of the first information processing terminal 104A.

As illustrated in FIG. 8, a storage unit 22 stores an AI program 110 for implementing the function of the virtual human 27. That is, when a processor 20 executes the AI program 110, the AI unit 35 provided in a first AI server 6A is provided in the first information processing terminal 104A, as illustrated in FIG. 9.

In the AI-to-AI dialog system 100, dialog contents W are transmitted and received between the AI unit 35 (the virtual human 27) in the first information processing terminal 104A and an AI unit 35 (a virtual human 27) in a second AI server 6B.

Third Embodiment

In description of the present embodiment, members described in the first and second embodiments are assigned the same reference numerals, and description thereof is omitted.

Figure 10:
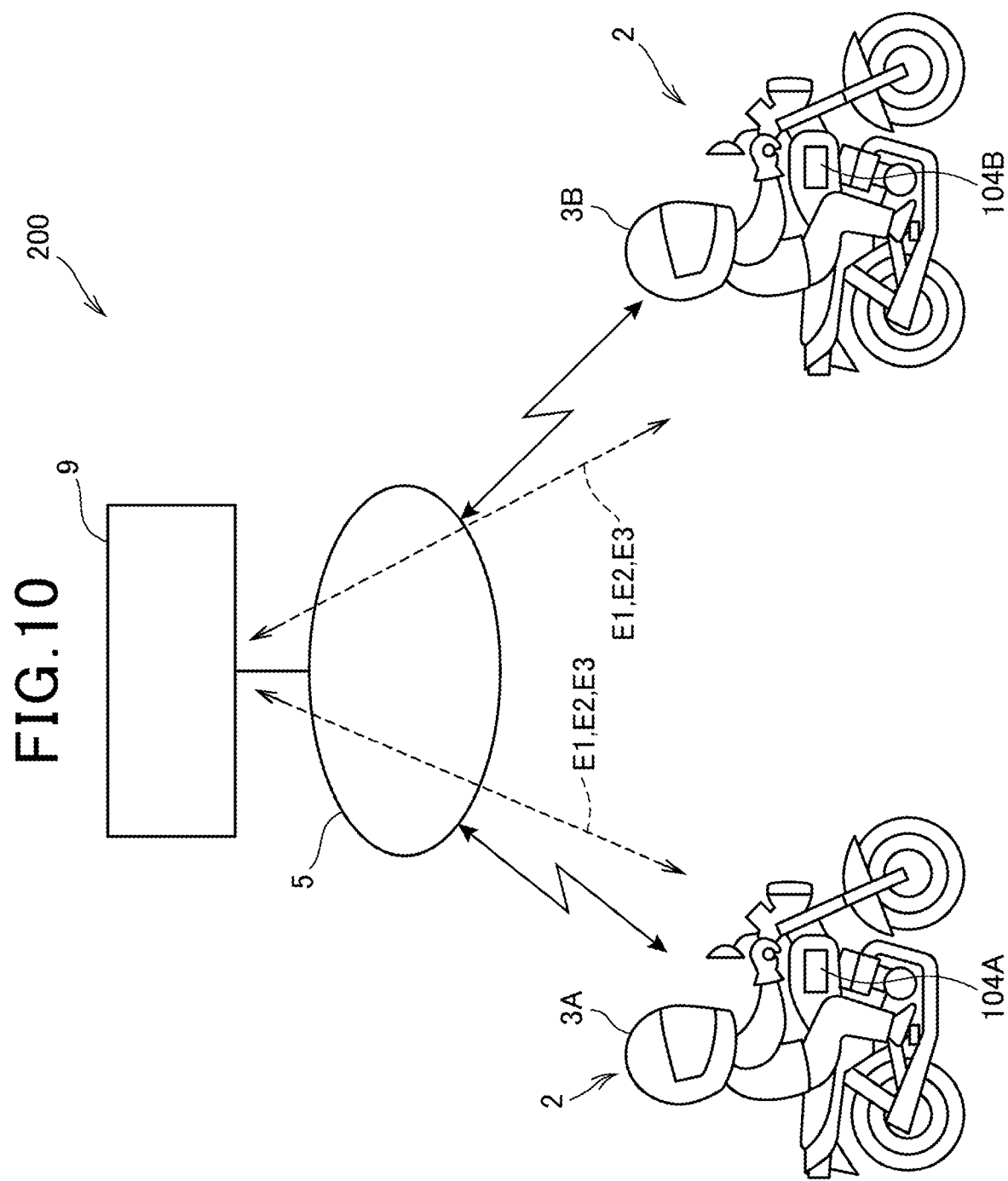
FIG. 10 is a diagram illustrating a configuration of an AI-to-AI dialog system according to a third embodiment of the present invention.

FIG. 10 is a diagram illustrating a configuration of an AI-to-AI dialog system 200 according to a third embodiment of the present invention.

As illustrated in FIG. 10, the AI-to-AI dialog system 200 differs in configuration from the AI-to-AI dialog system 100 according to the second embodiment in that a second information processing terminal 104B also includes an AI unit 35 to have a function of a virtual human 27 in addition to a first information processing terminal 104A.

In the AI-to-AI dialog system 200, dialog contents W respectively generated by the AI units 35 (the virtual humans 27) are transmitted and received between the first information processing terminal 104A and the second information processing terminal 104B.

Note that each of the above-described embodiments illustrates an aspect of the present invention and can be optionally deformed and applied without departing from the scope and spirit of the present invention.

Modifications

In each of the embodiments, the respective numbers of first information processing terminals 4A, 104A and second information processing terminals 4B, 104B are optional.

If the first information processing terminal 4A, 104A and the second information processing terminal 4B, 104B are of a vehicle-mounted type in each of the embodiments, a vehicle to be loaded therewith is not limited to a motorcycle 2, but is optional.

Any condition can be set in place or in addition to a distance as a dialog condition determined by a dialog processing server 9 in each of the embodiments.

Figure 11:
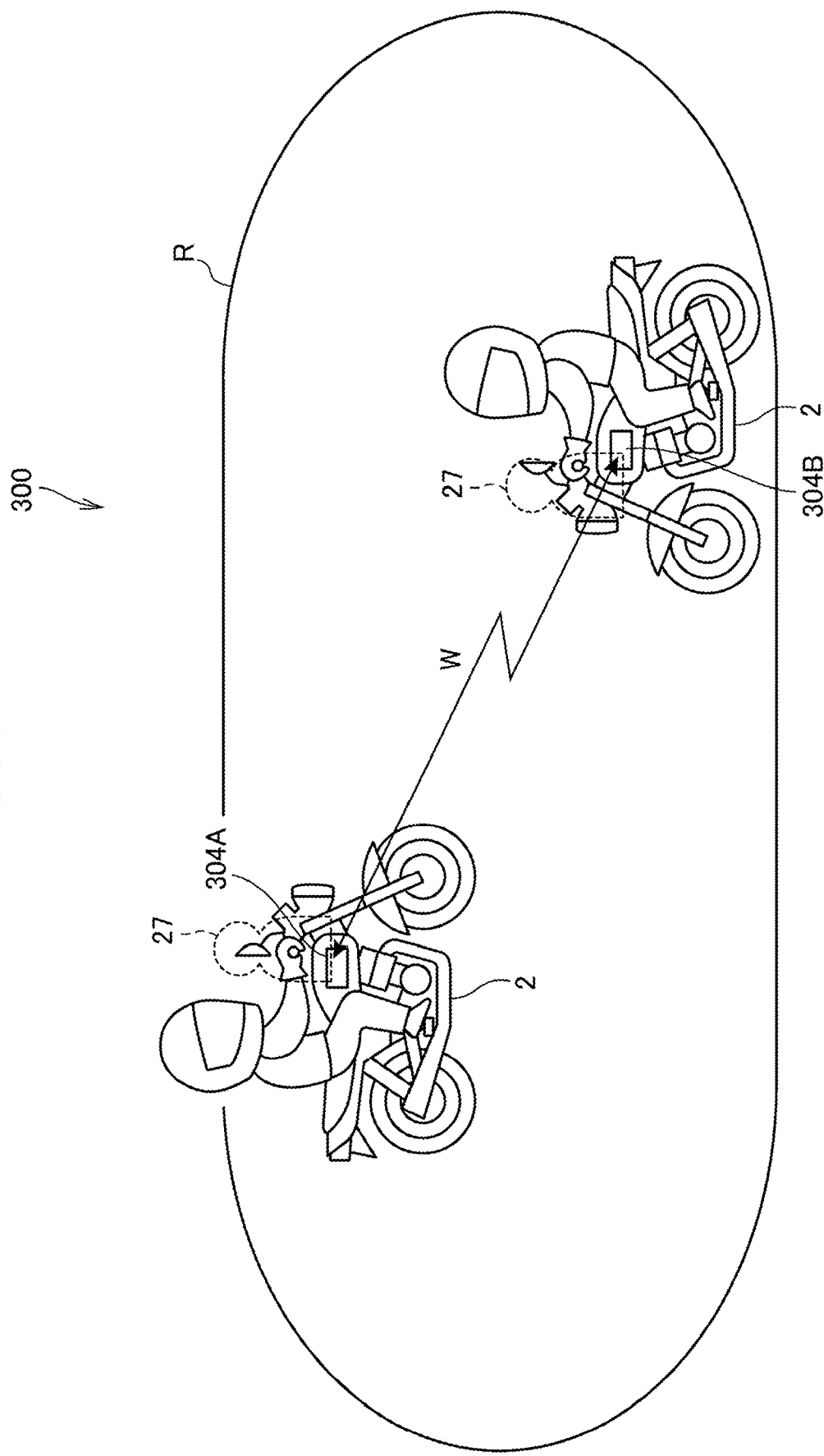
FIG. 11 is a diagram illustrating a configuration of an AI-to-AI dialog system according to a modification to the present invention.

If a dialog condition under which dialog contents W are transmitted and received between the first information processing terminal 4A, 104A and the second information processing terminal 4B, 104B is a distance in each of the embodiments, an AI-to-AI dialog system 300 as illustrated in FIG. 11 may be configured when the distance is a short distance.

In the AI-to-AI dialog system 300, a first information processing terminal 304A and a second information processing terminal 304B respectively include functions of virtual humans 27, like in the second embodiment, and a communication unit 12 performs short distance wireless communication using a short distance wireless communication protocol in addition thereto.

The short distance wireless communication is generally performed within a communication area R of several meters to several tens of meters around itself. For the short distance wireless communication protocol, Bluetooth (registered trademark), IrDA (registered trademark), RFID (Radio Frequency Identification), IEEE 802.11 (a so-called wireless LAN), and the like can be used.

The first information processing terminal 304A and the second information processing terminal 304B are respectively periodically searching for the second information processing terminal 304B and the first information processing terminal 304A as communication partners within a communication area R according to the short distance wireless communication protocol. If the communication partner has been found, the communication partner is positioned at a short distance within a range of the communication area R from itself. Accordingly, the above-described dialog condition using the distance as a condition has been established.

The first information processing terminal 304A and the second information processing terminal 304B start to transmit and receive the dialog contents W through the short distance wireless communication.

Then, application examples of the above-described embodiments will be described. The application examples of the first embodiment will be described below, and members already described are assigned the same reference numerals and description thereof is omitted. The following application examples are also applicable to second and third embodiments, unless otherwise specified.

First Application Example

Figure 12:
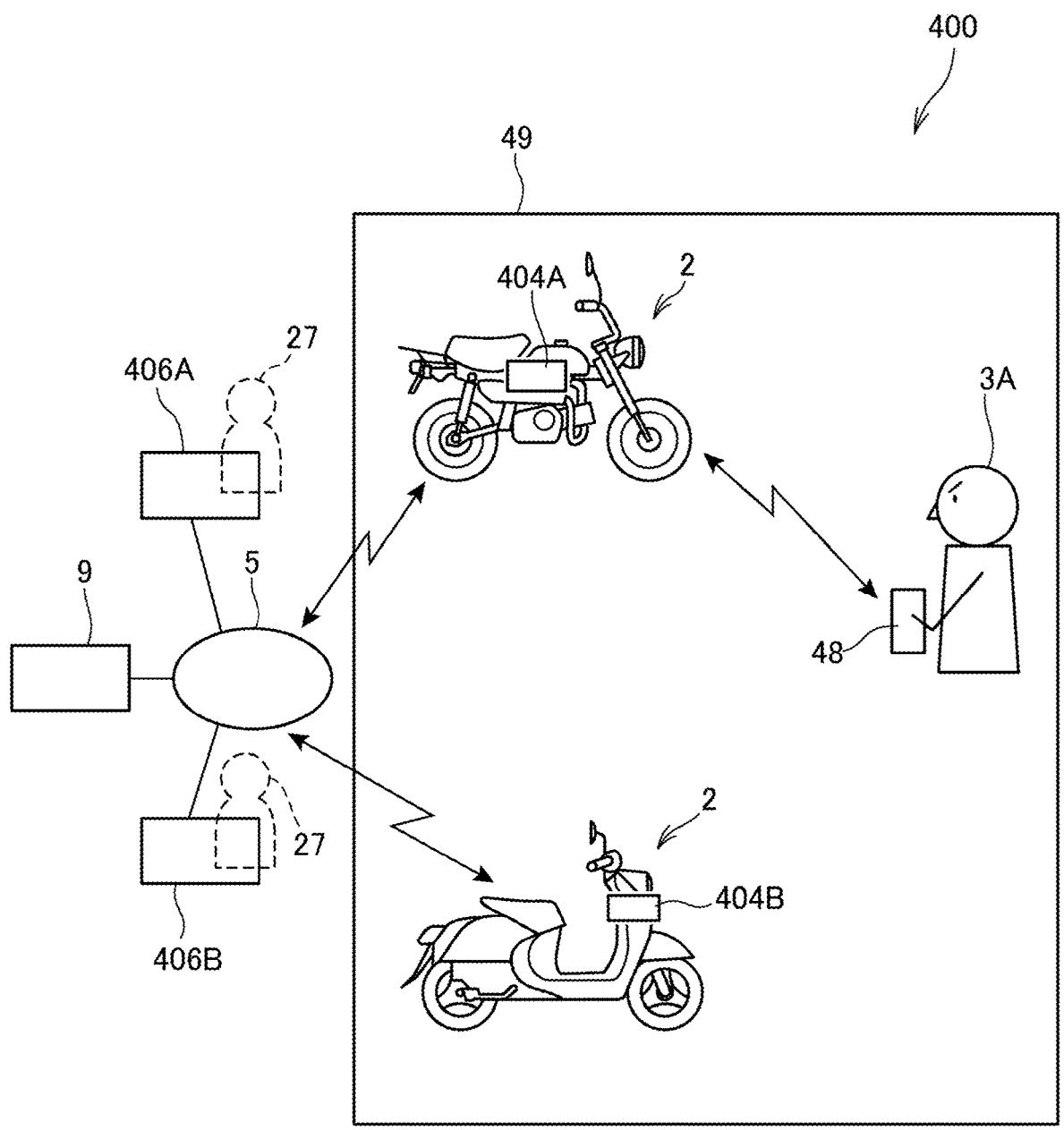
FIG. 12 is a diagram illustrating a configuration of an AI-to-AI dialog system according to a first application example of the present invention.

FIG. 12 is a diagram illustrating a configuration of an AI-to-AI dialog system 400 according to the present application example.

In the AI-to-AI dialog system 400, when a user 3A has come to a dealer 49, a first information processing terminal 404A and a second information processing terminal 404B respectively loaded into motorcycles 2 start an AI-to-AI dialog, so that the user 3A easily grasps the motorcycle 2 which suits himself or herself via the AI-to-AI dialog, to promote sales of the motorcycle 2.

More specifically, the AI-to-AI dialog system 400 includes the first information processing terminal 404A and the second information processing terminal 404B respectively loaded into the motorcycles 2 displayed in the dealer 49, a first AI server 406A and a second AI server 406B, a dialog processing server 9, and a smartphone 48 as a user owned terminal owned by the user 3A.

In the AI-to-AI dialog system 400, a dialog condition determined by the dialog processing server 9 is that a distance between the first information processing terminal 404A and the second information processing terminal 404B is a predetermined distance, like in the first embodiment. As the predetermined distance, a distance within which the first information processing terminal 404A and the second information processing terminal 404B are considered to be positioned in the same dealer 49 is set.

If the dialog condition has been established, respective virtual humans 27 in the first AI server 406A and the second AI server 406B start a AI-to-AI dialog via the first information processing terminal 404A and the second information processing terminal 404B, like in the first embodiment.

In the AI-to-AI dialog system 400, the AI-to-AI dialog is a so-called chat (hereinafter referred to as a "chat dialog").

The "chat" is one form of a dialog, and means a discursive dialog. The chat dialog in the present application example contains a topic suggesting compatibility between the motorcycles 2 respectively loaded with the first information processing terminal 404A and the second information processing terminal 404B themselves and the user 3A (hereinafter referred to as a "compatibility suggesting topic"), and differs from a mere chat in this respect.

Figure 13:
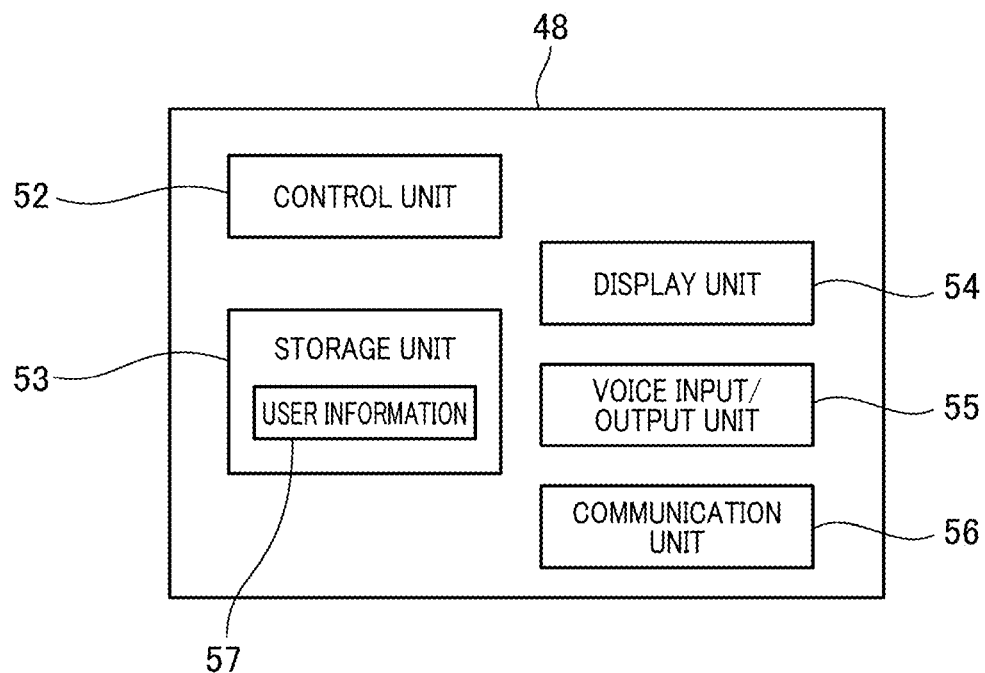
FIG. 13 is a block diagram illustrating a functional configuration of a smartphone according to the first application example.

FIG. 13 is a block diagram illustrating a functional configuration of the smartphone 48.

The smartphone 48 is a portable information processing terminal having a screen display function, a voice input/output function, and a communication function. Note that a mobile phone, a lap top PC, a portable music player, a portable game machine, or the like can also be used instead of the smartphone 48 as a portable information processing terminal.

The smartphone 48 according to the present application example includes a control unit 52, a storage unit 53, a display unit 54, a voice input/output unit 55, and a communication unit 56, as illustrated in FIG. 13.

The control unit 52 includes a processor, and implements, when the processor executes various types of programs, respectively, functions corresponding to the programs. The storage unit 53 stores the programs and various types of data. The display unit 54 outputs various types of information by display. The voice input/output unit 55 acquires a voice from outside, and outputs the voice to outside. The communication unit 56 communicates with the first information processing terminal 404A and the second information processing terminal 404B.

The storage unit 53 stores user information 57 appropriately set by the user 3A.

Figure 14:
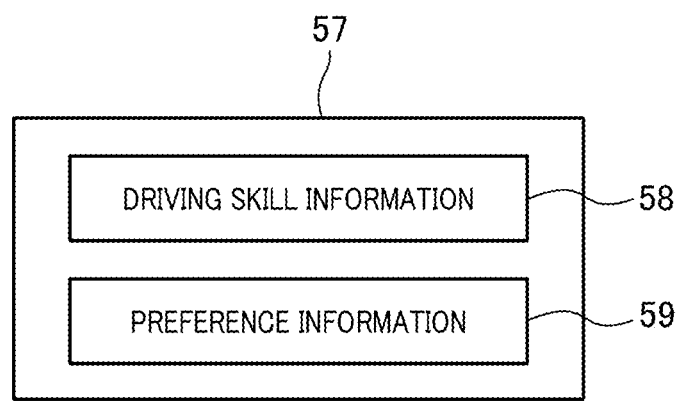
FIG. 14 is a diagram schematically illustrating user information.

FIG. 14 is a diagram schematically illustrating the user information 57.

The user information 57 is referred to when the first AI server 406A determines compatibility between the motorcycle 2 and the user 3A, and includes driving skill information 58 and preference information 59.

The driving skill information 58 is information representing a degree of a driving skill of the user 3A. Examples of the driving skill information 58 include a driving history, a history of types of purchased vehicles, a type of vehicle of a driver license obtained by the user 3A, a touring history (a frequency, a traveling distance, a destination, a traveling time, etc.), and a driving operation history (a driving frequency, a timing of a brake operation, etc.).

The preference information 59 is information such as a preference of the user 3A and particular points (a type of vehicle, a color of a vehicle body, etc.) for the motorcycle 2.

Note that the user information 57 may include any other information.

Then, the first information processing terminal 404A and the second information processing terminal 404B will be described in detail.

Note that since respective configurations of the first information processing terminal 404A and the second information processing terminal 404B are the same, the first information processing terminal 404A out of them will be described.

Figure 15:
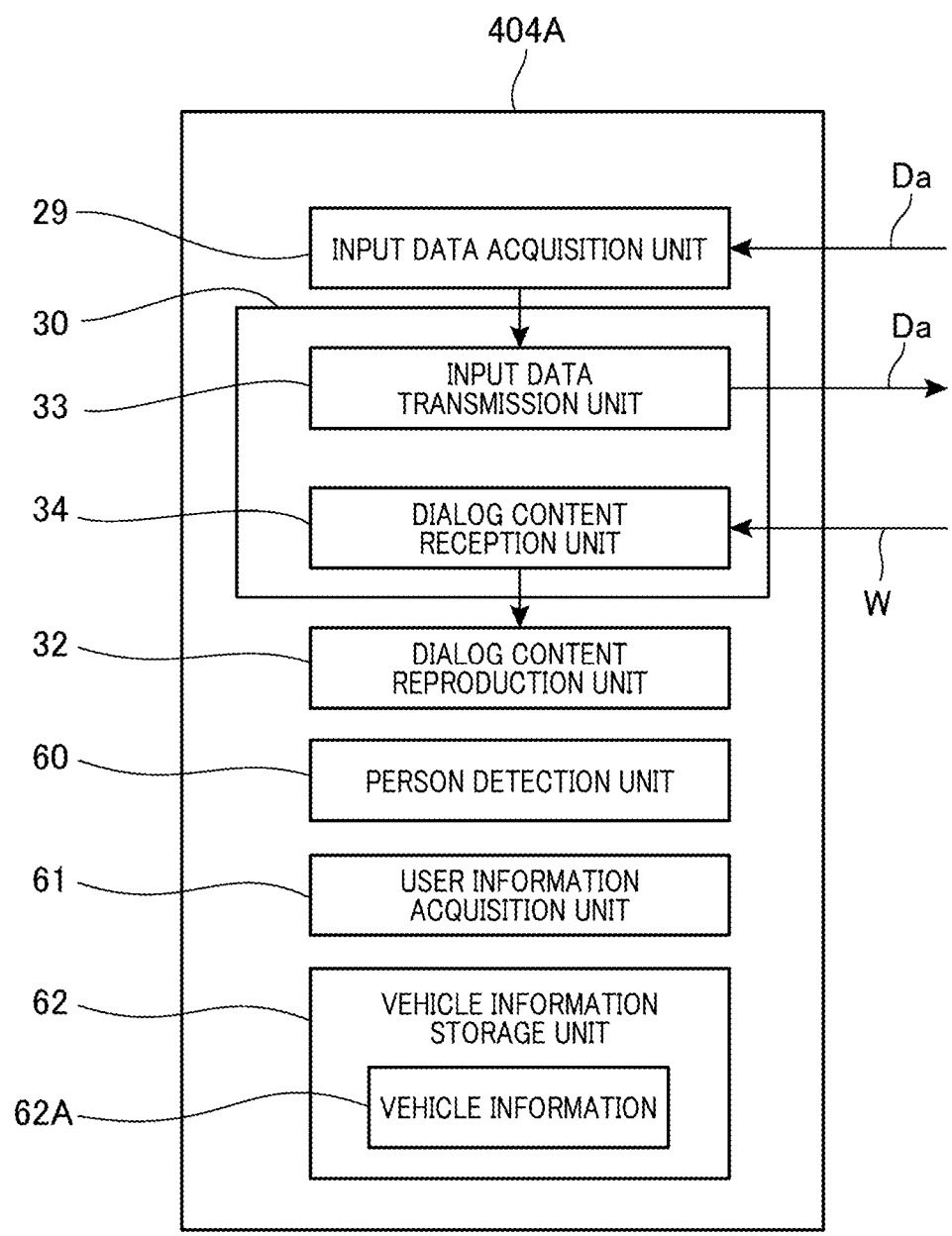
FIG. 15 is a block diagram illustrating a functional configuration of a first information processing terminal according to the first application example.

FIG. 15 is a block diagram illustrating a functional configuration of the first information processing terminal 404A.

As illustrated in FIG. 15, the first information processing terminal 404A includes a person detection unit 60, a user information acquisition unit 61, and a vehicle information storage unit 62 in addition to the units provided in the first information processing terminal 4A described in the first embodiment.

The person detection unit 60 detects an appearance of the user 3A around itself using a human sensor such as an imaging sensor 26 or an infrared sensor.

The user information acquisition unit 61 performs short distance wireless communication with the smartphone 48, and acquires the user information 57 from the smartphone 48.

The vehicle information storage unit 62 stores vehicle information 62A of the motorcycle 2 loaded with the first information processing terminal 404A.

The vehicle information 62A is information including information about the motorcycle 2 and a request skill level. Examples of the information about the motorcycle 2 include a type of vehicle, a performance (a size, a weight, a rigidity, etc.) of a vehicle body, a performance of a main part (an engine, a brake, a tire, etc.), and a feature (a color of the vehicle body, a material for the part, a brand, etc.) of the motorcycle 2. Examples of the request skill level include a length of a driving history and presence or absence of a driving experience of the same type of vehicle as an own vehicle.

The vehicle information 62A is stored in the vehicle information storage unit 62 when the motorcycle 2 is delivered to the dealer 49, for example. Then, when the vehicle performance and the request skill level have been changed due to a change of the part, for example, the vehicle information 62A is updated in response to the change.

Note that when a database recording the vehicle performance and the request skill level of each of the motorcycles 2 is constructed by a manufacturer, for example, the first information processing terminal 404A may acquire a vehicle performance of the own vehicle from the database. The database is arranged at a server terminal on the Internet or a local computer terminal installed in the dealer, for example. The first information processing terminal 404A may communicate with a terminal at which the database is arranged via a communication unit 12 and acquire the vehicle performance of the own vehicle.

The first information processing terminal 404A starts, when it receives a dialog enable signal E3, described above, transmitted from the dialog processing server 9 when the dialog condition has been established, the chat dialog if the person detection unit 60 detects a person around. That is, the first information processing terminal 404A acquires the user information 57 from the smartphone 48, transmits the user information 57 and the vehicle information 62A as input data Da to the first AI server 406A, and causes the first AI server 406A to generate a dialog content W.

On the other hand, the second information processing terminal 404B acquires, when it receives a dialog enable signal E3, user information 57 if the user information 57 has not been acquired yet from the smartphone 48. The second information processing terminal 404B transmits, when it receives the dialog content W from the first AI server 406A, input data Da including the dialog content W and the user information 57 to the second AI server 406B, and causes the second AI server 406B to generate a dialog content W.

Then, the first AI server 406A and the second AI server 406B will be described in detail.

Note that since respective configurations of the first AI server 406A and the second AI server 406B are the same, the first AI server 406A out of them will be described.

Figure 16:
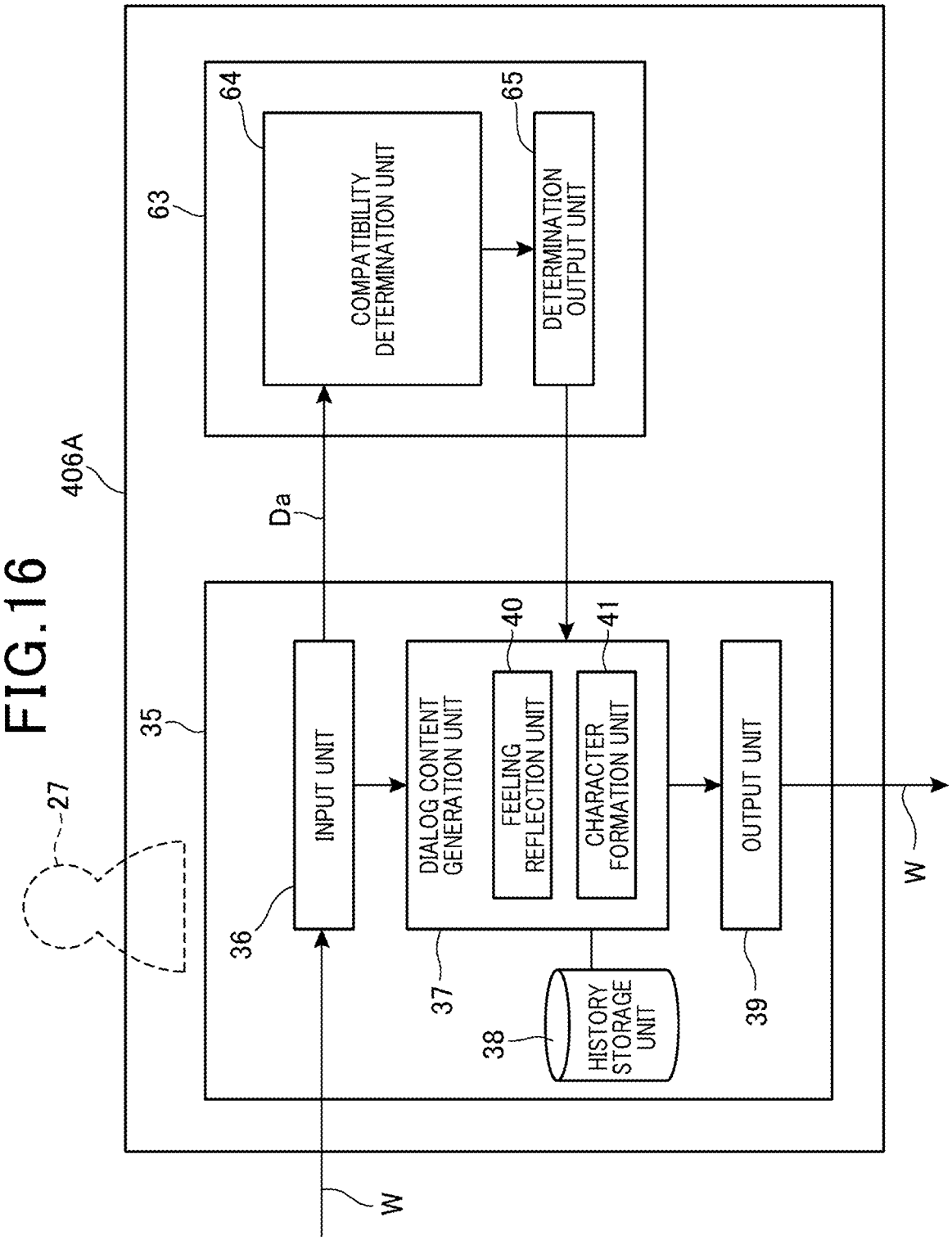
FIG. 16 is a block diagram illustrating a functional configuration of a first AI server according to the first application example.

FIG. 16 is a block diagram illustrating a functional configuration of the first AI server 406A.

The first AI server 406A includes a compatibility reflection unit 63 to generate a dialog content W including a compatibility suggesting topic in addition to the units provided in the first AI server 6A described in the first embodiment.

The compatibility reflection unit 63 reflects the compatibility between the user 3A and the motorcycle 2 loaded with itself on the dialog content W, as described above, and includes a compatibility determination unit 64 and a determination output unit 65.

The compatibility determination unit 64 compares the request skill level of the motorcycle 2 with the driving skill of the user 3A, and further compares the performance and the feature of the motorcycle 2 with the preference of the user 3A based on the vehicle information 62A and the user information 57. The compatibility determination unit 64 determines the compatibility based on respective comparison results. In the determination of the compatibility, determination more mainly using (placing greater emphasis on) the result of the comparison with the skill than the result of the comparison with the preference is performed to increase the compatibility of the motorcycle 2 corresponding to the driving skill of the user 3A. If at least the driving skill of the user 3A does not correspond to the request skill level, it is determined that the "compatibility is poor".

The determination output unit 65 inputs factors which have respectively affected a degree of compatibility (a high degree or a low degree) and a compatibility determination result to a dialog content generation unit 37.

The dialog content generation unit 37 generates a dialog content W for input from the determination output unit 65. As a result, a dialog content W having a content including the above-described compatibility suggesting topic is generated.

If a compatibility determination result becomes better because the driving skill of the user 3A is higher than the request skill level, for example, a dialog content W having a content such as "He will drive well" or "He is sure to be satisfied with my performance" is generated. When the driving skill of the user 3A is excessively higher than the request skill level of the motorcycle 2, if the compatibility determination result becomes rather bad, a dialog content W having a content such as "My performance may not be enough" is generated. If the driving skill of the user 3A is lower than the request skill level and the compatibility determination result is bad, a dialog content W having a content such as "He may not drive well" or "He may be overengineered" is generated.

If the compatibility is good in terms of the preference of the user 3A, for example, a dialog content W having a content such as "He may like this body color" or "I am compatible with him in terms of color" is generated. On the other hand, if the compatibility is poor in terms of the preference of the user 3A, a dialog content W such as "I may not a vehicle type liked by him" or "This body color may not suit him (He may hate the color)" is generated.

When the dialog content W having such a content is outputted from the first information processing terminal 404A, the user 3A can recognize the compatibility with the motorcycle 2.

Figure 17:
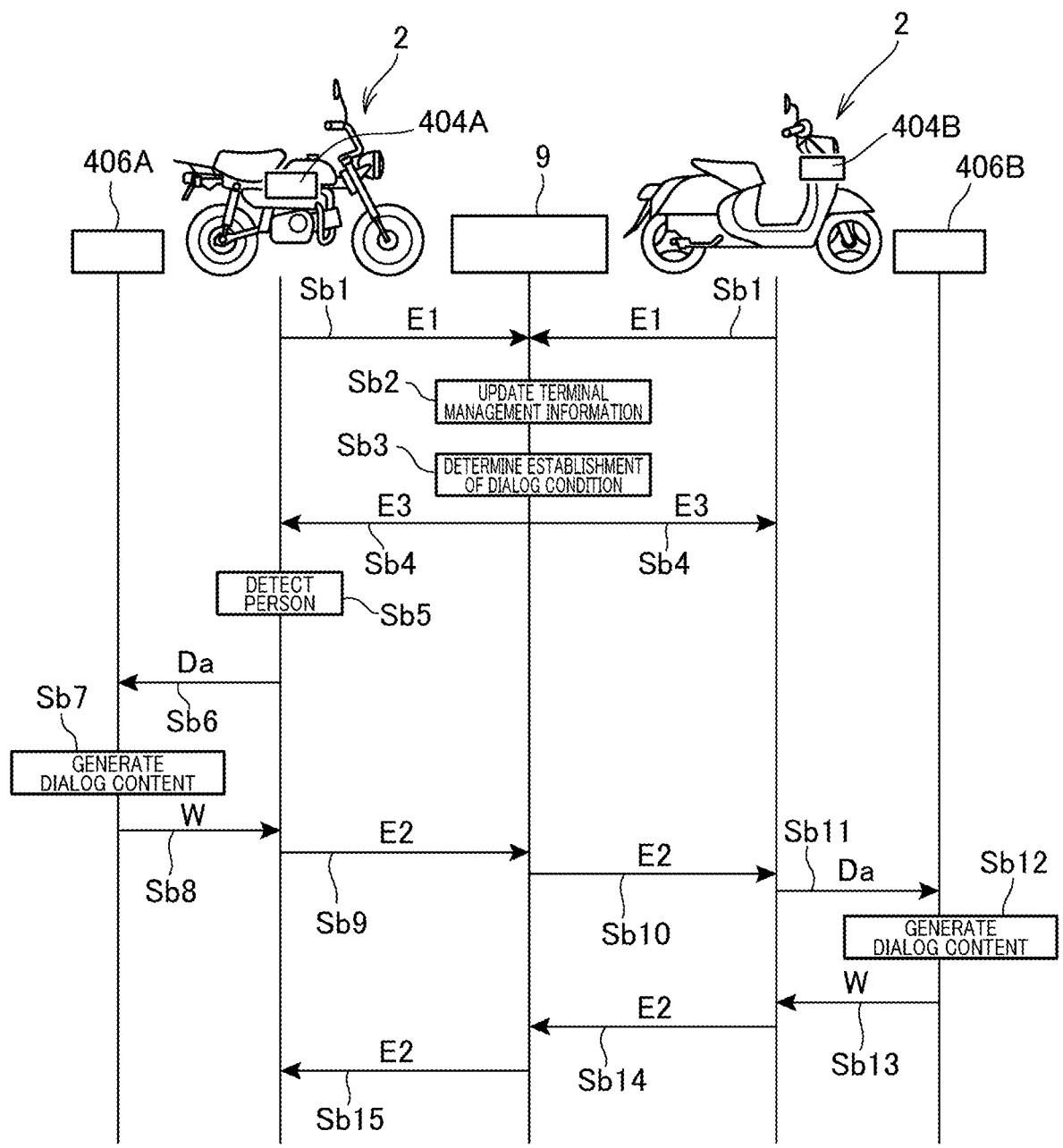
FIG. 17 is a sequence diagram of the AI-to-AI dialog system according to the first application example.

FIG. 17 is a sequence diagram of the AI-to-AI dialog system 400.

Processes in steps Sb1 to Sb4 are similar to those in steps Sa1 to Sa4 in the first embodiment.

If at least either one of the first information processing terminal 404A and the second information processing terminal 404B (the first information processing terminal 404A in an illustrated example) detects that the user 3A has appeared around itself (step Sb5), a chat dialog is started. That is, the first information processing terminal 404A acquires the user information 57 from the smartphone 48, and transmits the input data Da including the user information 57 and the vehicle information 62A to the first AI server 406A (step Sb6). The first AI server 406A generates, when it receives the input data Da, a dialog content W on which compatibility is reflected (step Sb7), and transmits the dialog content W to the first information processing terminal 404A (step Sb8).

The first information processing terminal 404A transmits, when it receives the dialog content W from the first AI server 406A, a second signal E2, described above, including the dialog content W and a device ID of a partner to the dialog processing server 9 to deliver the dialog content W to the partner (step Sb9).

Step Sb10 to step Sb15 are similar to step Sa10 to step Sa15 described in the first embodiment.

In step Sb12, the second information processing terminal 404B acquires, if it has not yet acquired the user information 57 from the smartphone 48, the user information 57, and then also includes the user information 57 in the input data Da.

Through a series of operations, the dialog contents W generated by the first AI server 406A and the second AI server 406B are transmitted and received, respectively, via the first information processing terminal 404A and the second information processing terminal 404B, and a chat dialog is conducted between the first AI server 406A and the second AI server 406B.

The chat dialog ends when a predetermined end condition has been established. Examples of the end condition include a case where the user 3A has disappeared from around the first information processing terminal 404A and the second information processing terminal 404B and a case where an instruction to end the chat dialog has been issued by a staff in the dealer 49. Determination whether or not the end condition is established is performed by the first information processing terminal 404A and the second information processing terminal 404B.

Figure 18:
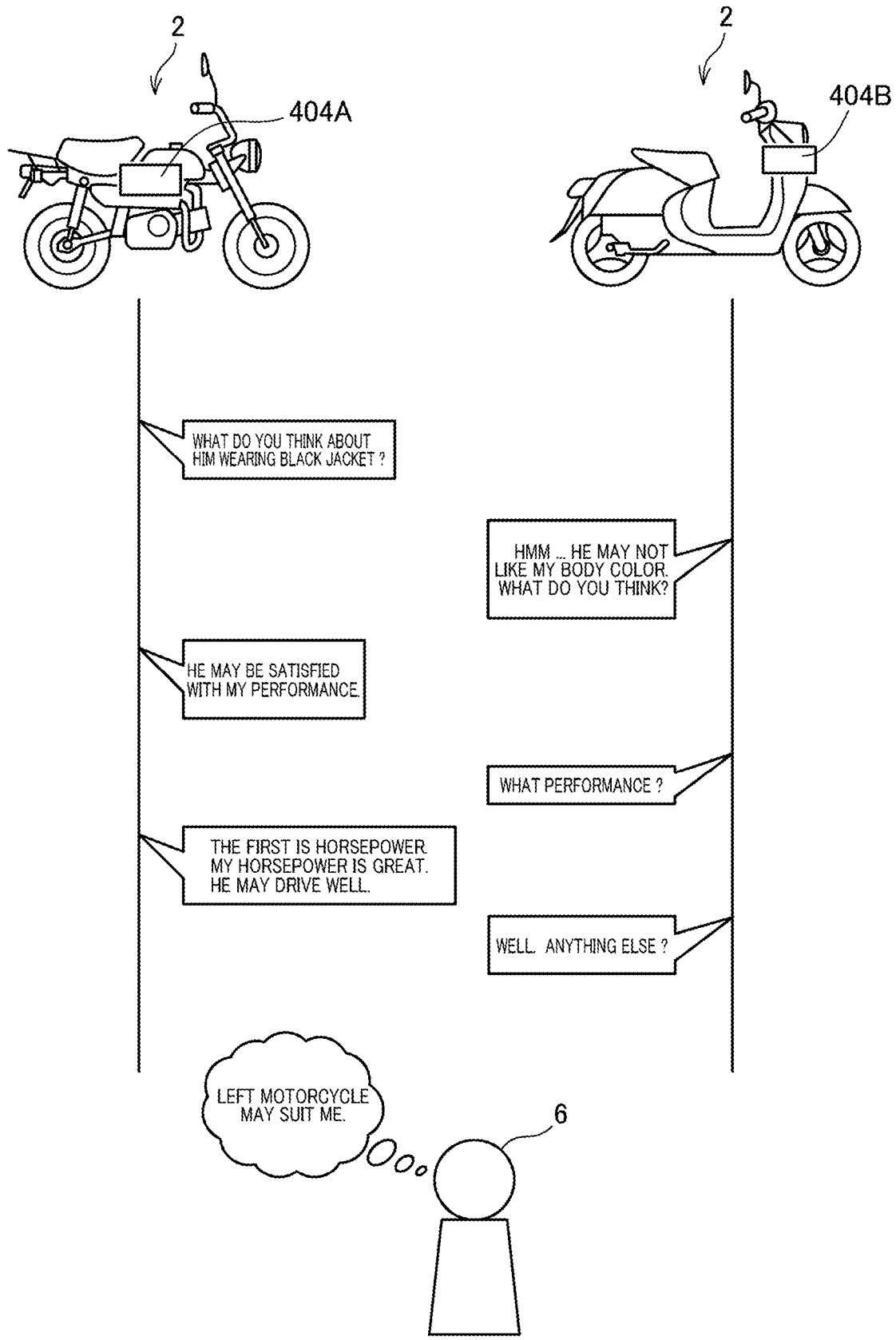
FIG. 18 is a schematic view illustrating a dialog example in a chat dialog in a timeline format.

FIG. 18 is a schematic view illustrating a dialog example in the chat dialog in a timeline format.

The chat dialog is conducted when the user 3A has appeared around, as illustrated in FIG. 18, so that a chat using compatibility between an own motorcycle 2 and the user 3A as a topic (a compatibility suggesting chat) is conducted. Therefore, the user 3A can easily find the motorcycle 2 which may be compatible with himself or herself based on a content of the chat dialog, and can know a performance and a feature of the motorcycle 2. In addition thereto, the user 3A can also objectively grasp respective characters of the first information processing terminal 404A and the second information processing terminal 404B via the chat dialog between the first information processing terminal 404A and the second information processing terminal 404B and find the first information processing terminal 404A and the second information processing terminal 404B with which himself or herself feels a sense of affinity.

According to the present application example, the following effect is produced.

That is, in the AI-to-AI dialog system 400, the AI units 35 (the virtual humans 27) in the first information processing terminal 404A and the second information processing terminal 404B chat with each other. Accordingly, the user 3A can feel a sense of affinity with the AI units 35. The user 3A can objectively grasp respective characters of the AI units 35.

A dialog content W including a topic about the motorcycles 2 is transmitted and received between the AI units 35 (the virtual humans 27) in the first information processing terminal 404A and the second information processing terminal 404B.

As a result, a content of the dialog content W to be transmitted and received is naturally provided as a material for determining purchase of the motorcycle 2 to the user 3A.

In the AI-to-AI dialog system 400, the first AI server 406A and the second AI server 406B respectively include the compatibility determination units 64 which determine compatibility based on the user information 57 of the user 3A who can purchase the motorcycle 2 and the vehicle information 62A of the motorcycle 2, and generate dialog contents W on which a determination result of the compatibility is reflected.

As a result, the user 3A can find the motorcycle 2 which is compatible with himself or herself based on respective contents of the dialog contents W.

Note that the present application example can also be modified as follows.

Modification 1A

In the application example 1, a case where a topic for a chat dialog includes compatibility suggestion is illustrated. However, the topic for the chat dialog may be a material for determining purchase of a motorcycle 2 or may be a content other than the compatibility suggestion. Examples of this type of content include a performance and a feature of the motorcycle 2.

In this case, vehicle information 62A is inputted to each of dialog content generation units 37 in a first AI server 406A and a second AI server 406B, to generate a dialog content W representing the performance and the feature of the motorcycle 2. When the dialog content W is appropriately inserted into the chat dialog, the performance and the feature of the motorcycle 2 can be naturally notified to a user 3A and promoted. In this case, the dialog content generation unit 37 may efficiently promote the motorcycle 2 by preferentially selecting information for stimulating a purchasing intension of the user 3A (a selling point of the motorcycle 2, etc.) in the vehicle information 62A and uttering the information.

The topic for the chat dialog may include compatibility between a character of the user 3A and a character of each of a first information processing terminal 404A and a second information processing terminal 404B.

The character of the user 3A can be estimated from information about an appearance or a figure, an uttered voice (a tone and a choice of words) of the user 3A. That is, an AI unit 35 in each of the first AI server 406A and the second AI server 406B receives image data in which the appearance and the figure of the user 3A are captured and voice data of the uttered voice of the user 3A as input data Da, and estimates the character of the user 3A. A machine learning technique or the like can be used for estimation of the character based on the input data Da, like for estimation of a feeling.

Modification 1B

While a motorcycle 2 is displayed in a dealer 49, i.e., while a buyer for the motorcycle 2 is not found, respective virtual humans 27 in a first AI server 406A and a second AI server 406B can also store knowledge by machine learning.

That is, each of AI units 35 stores learning information prepared by a sales side such as the dealer 49 or a manufacturer in the history storage unit 38 until a buyer is found, and performs reinforcement learning of a dialog content generation unit 37 based on the learning information. As a result, an algorithm for dialog generation processing performed by the dialog content generation unit 37 (a dialog content generation rule) is brushed up such that the longer the motorcycle 2 is placed in the dealer 49, the larger an amount of learning information reflected on the dialog content W to be generated becomes.

Examples of the learning information include motorcycle related information and area information about an area where the dealer 49 is positioned. The motorcycle related information is information which can be beneficial for an owner of a motorcycle 2, e.g., information about a maintenance or well-known and common technique information in a motorcycle field. The area information is the information about the area where the dealer 49 is positioned, and examples of the area information include position information of various types of stores and facilities and information about a history, a custom, or the like.

As a result, the longer the motorcycle 2 is placed in the dealer 49, the larger an amount of learning information (a so-called knowledge) held by each of the AI units 35 in the first AI server 406A and the second AI server 406B becomes so that the dialog content W is diversified. Accordingly, an added value of the motorcycle 2 is increased, and purchasing power of the motorcycle 2 is supplemented.

Modification 1C

A computer (e.g., a dialog processing server 9) communicably connected to a communication line 5 may hold user information 57, and a first information processing terminal 404A and a second information processing terminal 404B may acquire the user information 57 from the computer.

Modification 1D

A smartphone 48 may have a function of using an AI dialog service provided by a first AI server 406A and a second AI server 506B and an AI-to-AI dialog service provided by a dialog processing server 9, like a first information processing terminal 404A and a second information processing terminal 404B, to participate in a chat dialog.

Modification 1E

If a first information processing terminal 404A and a second information processing terminal 404B are in close proximity to each other, the first information processing terminal 404A and the second information processing terminal 404B may acquire voices of dialog contents W respectively outputted thereby from a voice input/output unit 14 instead of transmitting and receiving the dialog contents W via a dialog processing server 9.

In this case, to make it possible to specify to whom the voices acquired by the voice input/output unit 14 are emitted in a chat dialog, each of the first information processing terminal 404A and the second information processing terminal 404B desirably transmits a signal including chat dialog information through short distance wireless communication to match a timing of voice output of the dialog content W.

The chat dialog information includes at least a device ID of each of the first information processing terminal 404A and the second information processing terminal 404B and a device ID of a chat partner.

If each of the first information processing terminal 404A and the second information processing terminal 404B detects a voice in a dialog, it can be determined whether or not the voice is in a chat dialog and is in a dialog directed at itself based on the chat dialog information.

Second Application Example

Figure 19:
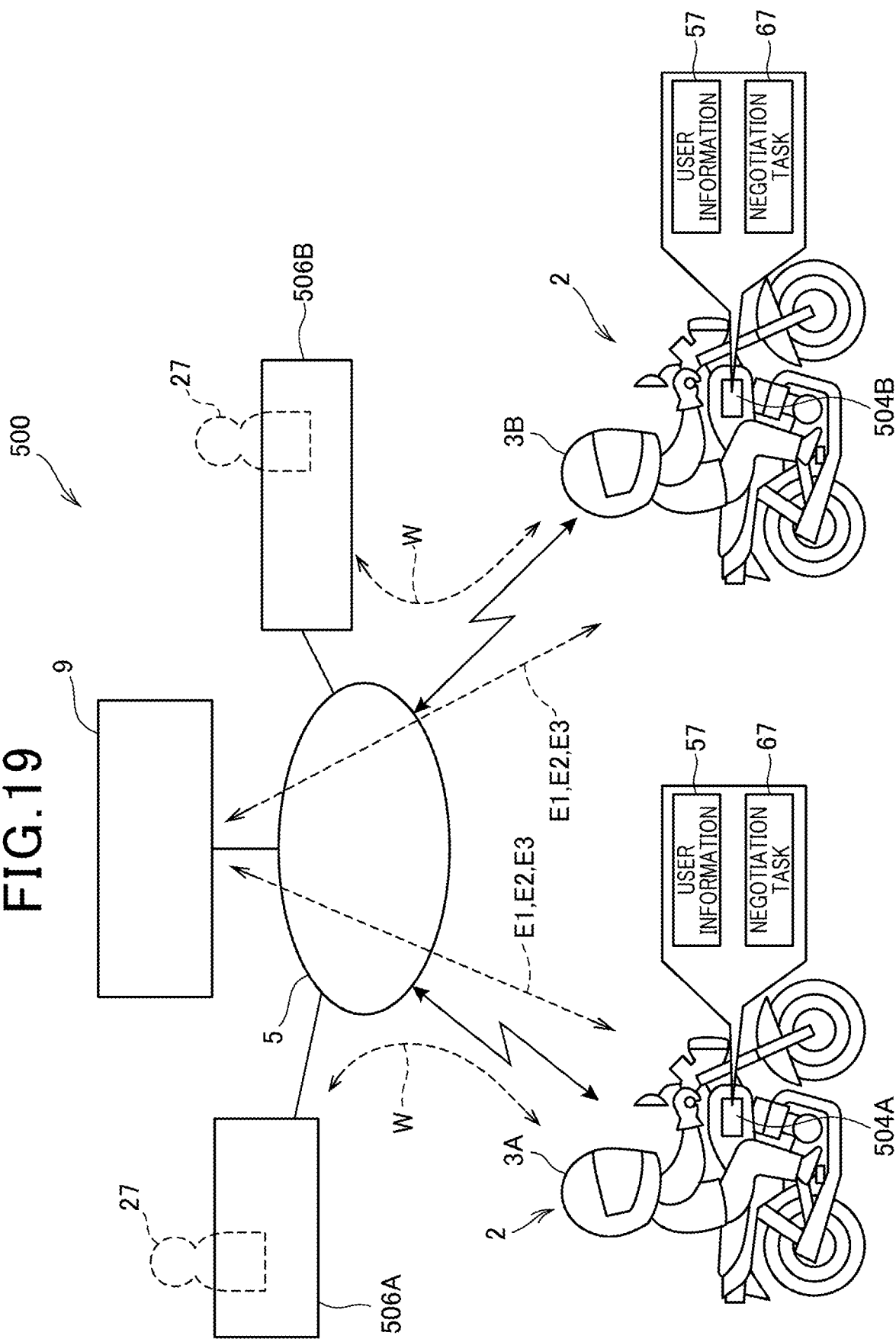
FIG. 19 is a diagram illustrating a configuration of an AI-to-AI dialog system according to a second application example of the present invention.

FIG. 19 is a diagram illustrating a configuration of an AI-to-AI dialog system 500 according to the present application example.

In the present application example, when a dialog condition is established, a first information processing terminal 504A and a second information processing terminal 504B conduct a dialog instead of users 3A and 3B as respective owners of motorcycles 2 (hereinafter referred to as a "proxy dialog").

In the present application example, the dialog condition is that a distance between the first information processing terminal 504A and the second information processing terminal 504B is a predetermined distance or less, like in the first embodiment.

In the present application example, a topic for the proxy dialog is a topic relating to a negotiation (including a request) between the users 3A and 3B, and a content of the negotiation is previously set in the first information processing terminal 504A and the second information processing terminal 504B, respectively, as negotiation tasks 67 by the users 3A and 3B.

Figure 20:
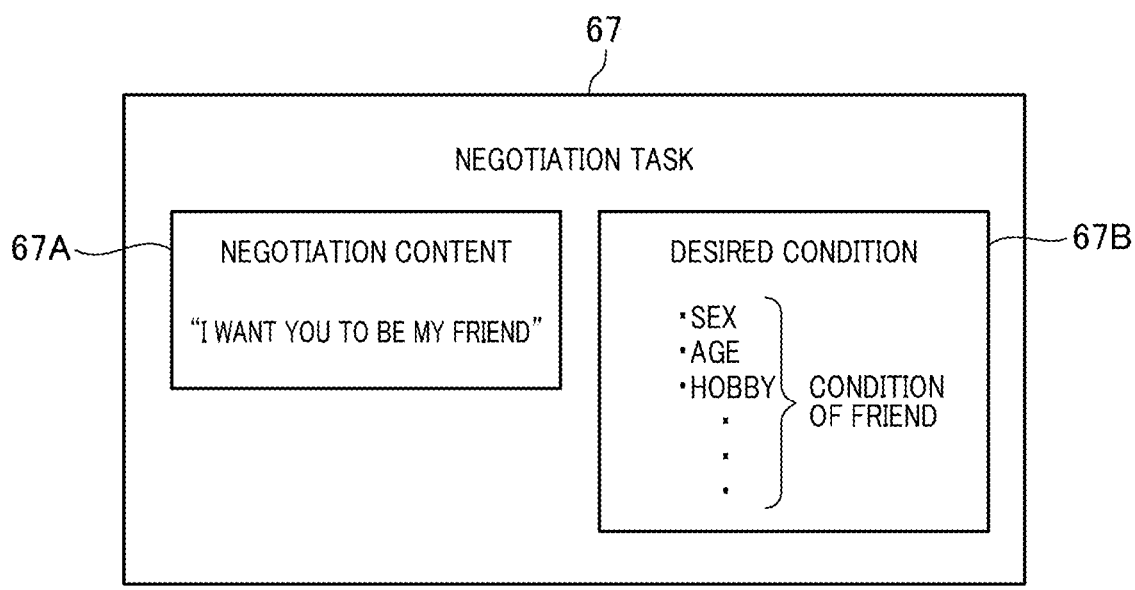
FIG. 20 is a schematic view of a negotiation task.

FIG. 20 is a schematic view of the negotiation task 67.

The negotiation task 67 represents a negotiation content desired by each of the users 3A and 3B, and includes a negotiation content 67A and a desired condition 67B. The negotiation content 67A is information indicating about what a negotiation is conducted. The desired condition 67B is information representing a desired condition of each of the users 3A and 3B in the negotiation.

If each of the users 3A and 3B desires to make a friend, for example, the negotiation content 67A stores "I want you to be my friend". In this case, the desired condition 67B stores a condition of a partner whom each of the users 3A and 3B wants to be his or her friend, for example. In this case, user information 57 including personal information of the users 3A and 3B are also respectively provided in the first information processing terminal 504A and the second information processing terminal 504B to be used for the negotiation with the negotiation partner. The personal information are respectively information representing personalities of the users 3A and 3B, and examples of the personal information include a sex, an age, a residence area, a hobby, a preference, a driving history of a motorcycle 2, and a behavior history such as a schedule.

Then, a first AI server 506A and a second AI server 506B will be described in detail.

Note that since respective configurations of the first AI server 506A and the second AI server 506B are the same, the first AI server 506A out of them will be described.

Figure 21:
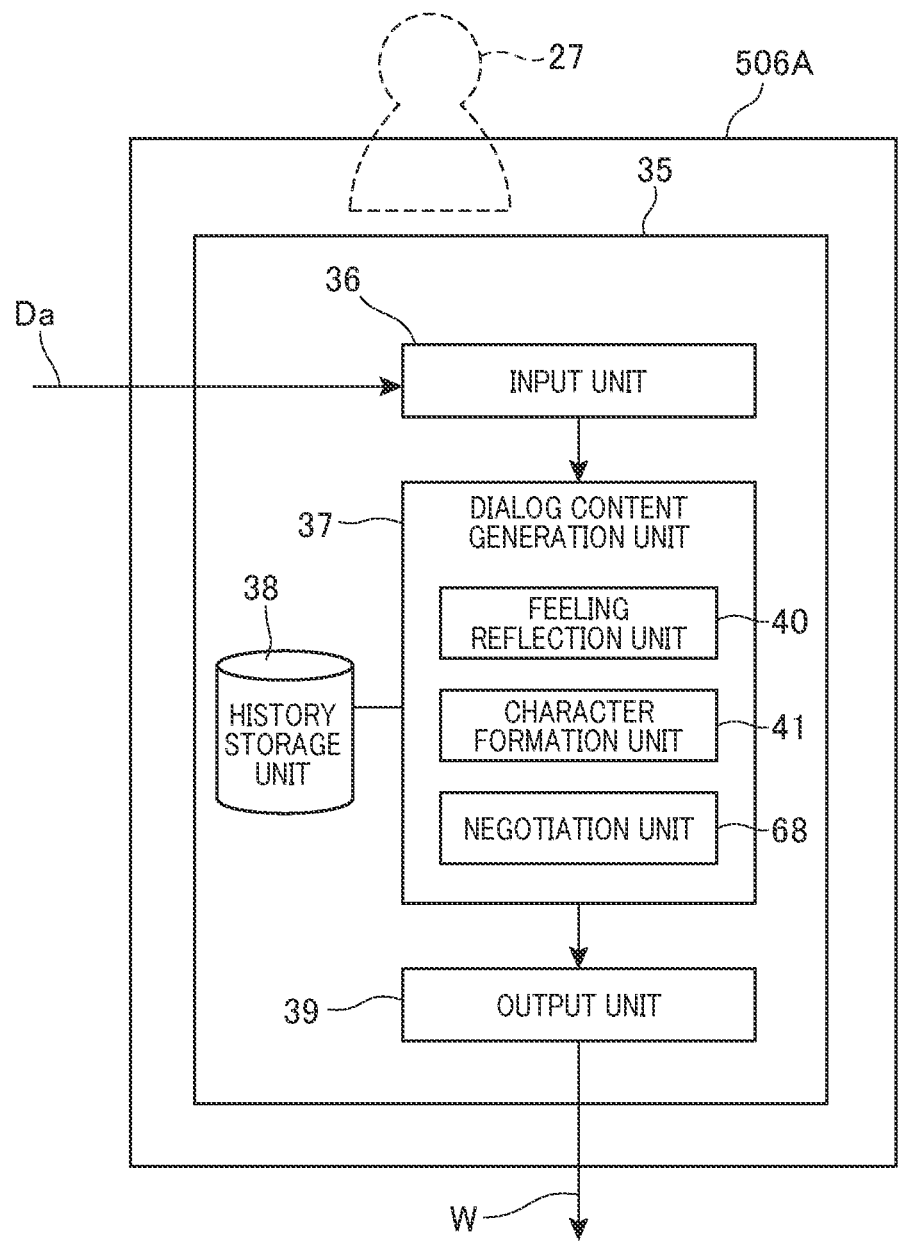
FIG. 21 is a block diagram illustrating a functional configuration of a first AI server according to the second application example.

FIG. 21 is a block diagram illustrating a functional configuration of the first AI server 506A.

In the first AI server 506A, a negotiation unit 68 is provided in a dialog content generation unit 37 to generate a dialog content W in the proxy dialog in addition to the units provided in the first AI server 6A described in the first embodiment.

The negotiation unit 68 generates the dialog content W used for a negotiation with a partner when input data Da including the negotiation task 67 is inputted thereto. For processing of the negotiation unit 68, an artificial intelligence using a neural network and machine learning is also used, like in the feeling reflection unit 40.

Figure 22:
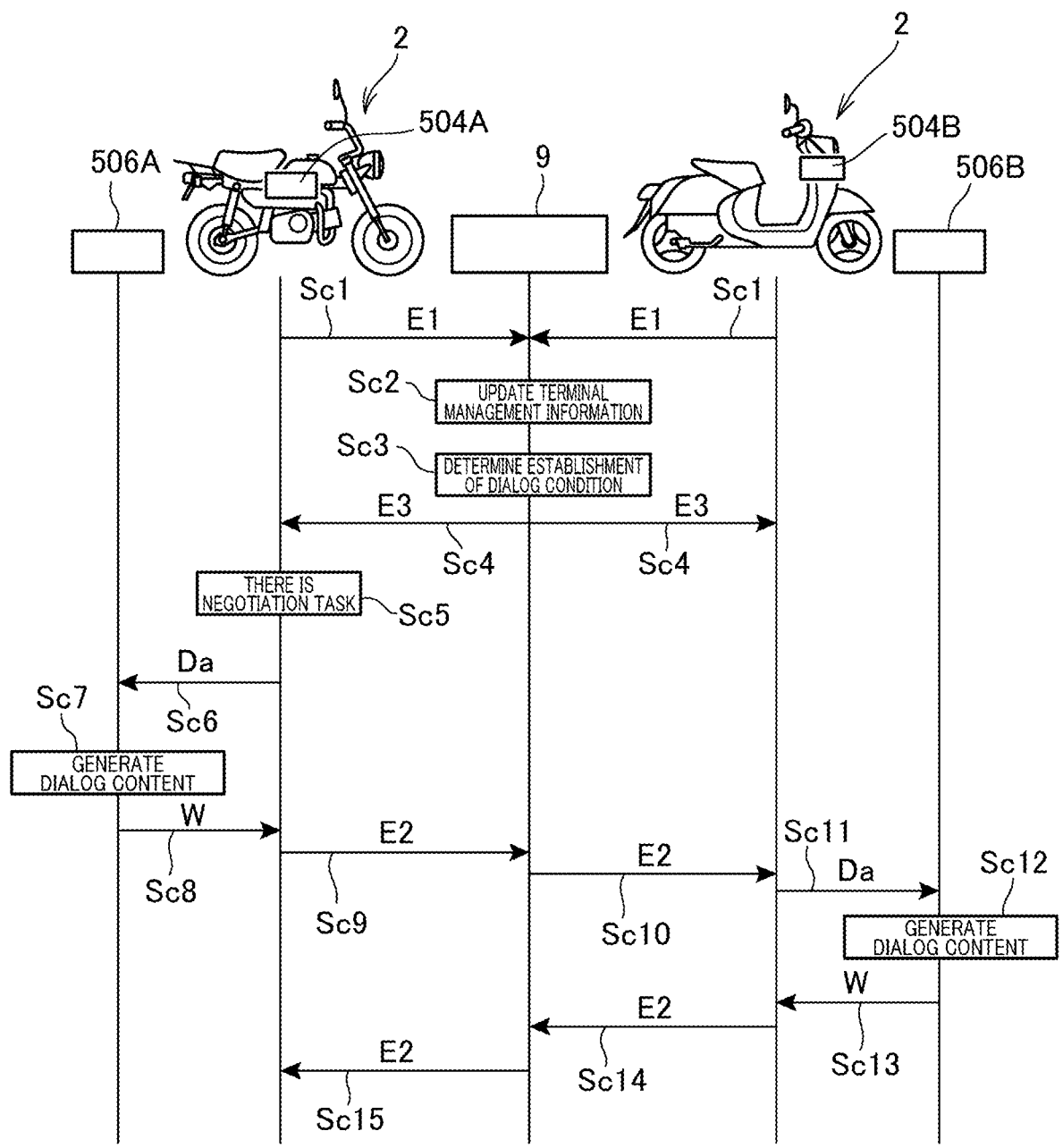
FIG. 22 is a sequence diagram of the AI-to-AI dialog system according to the second application example.

FIG. 22 is a sequence diagram of the AI-to-AI dialog system 500.

Processes in steps Sc1 to Sc4 are similar to those in steps Sa1 to Sa4 in the first embodiment.

When the first information processing terminal 504A, for example, starts a negotiation based on the negotiation task 67 with the second information processing terminal 504B (step Sc5), the first information processing terminal 504A transmits the user information 57 and the negotiation task 67 as input data Da to the first AI server 506A (step Sc6). The first AI server 506A generates, when it receives the input data Da, a dialog content W based on a content of the negotiation task 67 (step Sc7), and transmits the dialog content W to the first information processing terminal 504A (step Sc8).

The first information processing terminal 504A transmits, when it receives the dialog content W from the first AI server 506A, a second signal E2, described above, including the dialog content W and a device ID of a partner to a dialog processing server 9 to deliver the dialog content W to the partner (step Sc9).

Processes in step Sc9 to step Sc15 are also similar to those in step Sa9 to step Sa15 in the first embodiment.

Through a series of operations, the dialog contents W are transmitted and received between the first AI server 506A and the second AI server 506B, so that a proxy dialog for negotiating the negotiation task 67 is conducted.

The proxy dialog relating to the negotiation ends when the negotiation is successfully or unsuccessfully completed.

In the present embodiment, the AI unit 35 in each of the first AI server 506A and the second AI server 506B determines whether the negotiation is successfully or unsuccessfully completed based on a content of a dialog content W which has been received from a partner. If the negotiation content 67A is "make a friend", for example, it is determined that the negotiation has been successfully completed when a dialog content W in a response of the partner includes "become a friend". On the other hand, it is determined that the negotiation has been unsuccessfully completed when the dialog content W in the response of the partner includes "I refuse".

Figure 23:
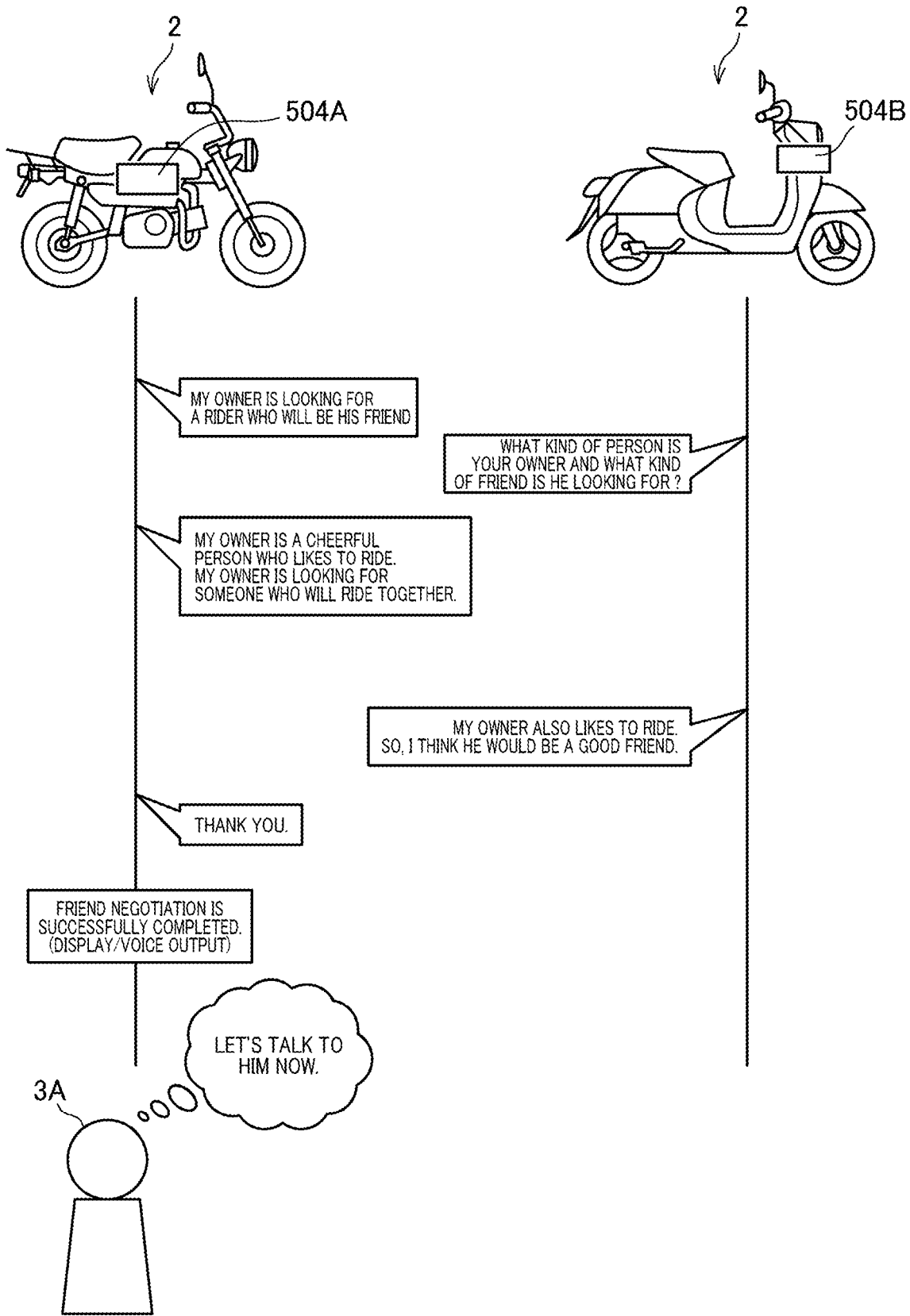
FIG. 23 is a schematic view illustrating a dialog example in a proxy dialog in a timeline format.

FIG. 23 is a schematic view illustrating a dialog example in a proxy dialog in a timeline format.

As illustrated in FIG. 23, when a distance between the first information processing terminal 504A and the second information processing terminal 504B is a predetermined distance or less, a proxy dialog which negotiates about the negotiation task 67 previously set by the user 3A is conducted.

As a result, each of the users 3A and 3B can actually take an action against a negotiation partner in response to a content of the dialog content W exchanged during the negotiation and successful completion/unsuccessful completion of the negotiation.

According to the present application example, the following effect is produced.

In the AI-to-AI dialog system 500 according to the present application example, the respective dialog contents W relating to the topic previously set by the users 3A and 3B are transmitted and received between the first AI server 506A and the second AI server 506B.

As a result, when the users 3A and 3B set a desired topic, the users 3A and 3B respectively enable the first AI server 506A and the second AI server 506B to conduct a dialog about the topic instead of themselves.

In the present application example, the topic in the dialog content W includes a negotiation desired by the users 3A and 3B.

As a result, the users 3A and 3B respectively entrust a negotiation having a content at which themselves are not good to the first AI server 506A and the second AI server 506B, and can also save time and effort to directly dialogue with each other. Each of the users 3A and 3B can use exchange of the dialog content W in the negotiation as a material for determining an action actually taken against a negotiation partner.

Note that the present application example can be modified as follows.

Modification 2A

In step Sc5, a first information processing terminal 504A and a second information processing terminal 504B need not start, when users 3A and 3B do not intend to conduct a negotiation, the negotiation.

That is, the first information processing terminal 504A and the second information processing terminal 504B confirm respective negotiation intentions of the users 3A and 3B before starting the negotiation. The first information processing terminal 504A and the second information processing terminal 504B start, when the intentions to start the negotiation are respectively confirmed by operations, voice inputs, and gestures (image inputs) of the users 3A and 3B, for example, the negotiation.

In step Sc7, AI units 35 in a first AI server 506A and a second AI server 506B may respectively know by analogy the negotiation intentions of the users 3A and 3B.

The negotiation intentions can be known by analogy based on contrast between a negotiation content 67A of a negotiation task 67 and a current situation. For the current situation, a current situation (a feeling, etc.) of each of the users 3A and 3B and a current surrounding environment (a current place, weather, scenery, a surrounding landmark, etc.) are referred to.

If the negotiation content 67A is "make a friend", for example, when respective current feelings of the users 3A and 3B are "temper", the first AI server 506A and the second AI server 506B respectively know by analogy that the users 3A and 3B do not feel like making friends at a current time point.

As a result, a useless negotiation can be prevented from being conducted regardless of the users 3A and 3B being in no mood.

The present modification can also be used as follows.

That is, the modification is used in a way of negotiating, when each of the users 3A and 3B wants a video (a picture or a movie) using himself or herself who is driving as an object, shooting of himself or herself with another motorcycle 2 (e.g., an oncoming vehicle or a vehicle which is traveling ahead) and requesting the shooting.

In this case, "shooting of a requester (user 3A, 3B) himself or herself" is set in the negotiation content 67A, and a situation where each of the users 3A and 3B himself or herself desires to be shot is set in a desired condition 67B. Since the AI unit 35 can estimate a feeling of each of the users 3A and 3B, a condition based on the feeling of the user, such as "When a (user 3A, 3B) himself or herself is desired to be shot" or "A (user 3A, 3B) feels refreshed", can be set in the situation.

When each of the users 3A and 3B has performed a gesture (e.g., a V sign) which suggests a desire of shooting with the desired condition 67B "When a (user 3A, 3B) himself or herself is desired to be shot" being set, it is determined that the desired condition 67B has been established. A feeling reflection unit 40 determines whether or not each of the users 3A and 3B feels "refreshment" with the desired condition 67B "When an (owner 106) feels refreshed" being set.

If a negotiation has been successfully completed between each of the users 3A and 3B and a negotiation partner, the negotiation partner shoots the user. Each of the first information processing terminal 504A and the second information processing terminal 504B acquires data obtained by the shooting from the negotiation partner via the dialog processing server 9, for example.

As a result, each of the users 3A and 3B can acquire shooting data obtained by shooting himself or herself in a desired situation even during traveling. A useless negotiation in a situation which is not set in the desired condition 67B by each of the users 3A and 3B and shooting as a result of the negotiation are suppressed.

Modification 2B

A dialog processing server 9 may have a function of intervening, when a negotiation partner outputs a dialog content W indicating that a negotiation has been unsuccessfully completed, in the negotiation such that the negotiation is not unsuccessfully completed as it is.

That is, a relay unit 44 in the dialog processing server 9 holds, when it relays a series of dialog contents W relating to the negotiation, the dialog contents W. If the negotiation has been unsuccessfully completed, the relay unit 44, for example, in the dialog processing server 9 determines whether or not unsuccessful completion of the negotiation is valid based on the dialog contents W. If it is determined that the unsuccessful completion of the negotiation is not valid, a negotiation partner is instructed to accept the successful completion.

Artificial intelligences can be used for validity determination processing performed by the relay unit 44 in the dialog processing server 9, like in AI units 35 in a first AI server 506A and a second AI server 506B.

The present modification is appropriate for a driving support at the time of traveling of a motorcycle 2. Examples of the driving support include an inter-vehicle distance and an interruption.

That is, each of users 3A and 3B sets a negotiation task 67 using a necessary driving support as a negotiation content 67A. Each of the users 3A and 3B sets, when he or she desires to ensure an inter-vehicle distance which is a minimum of a predetermined distance or more during vehicle traveling, a negotiation task 67 in which a negotiation content 67A is set as an "inter-vehicle distance" and a desired condition 67B is set as a "predetermined distance".

Figure 24:
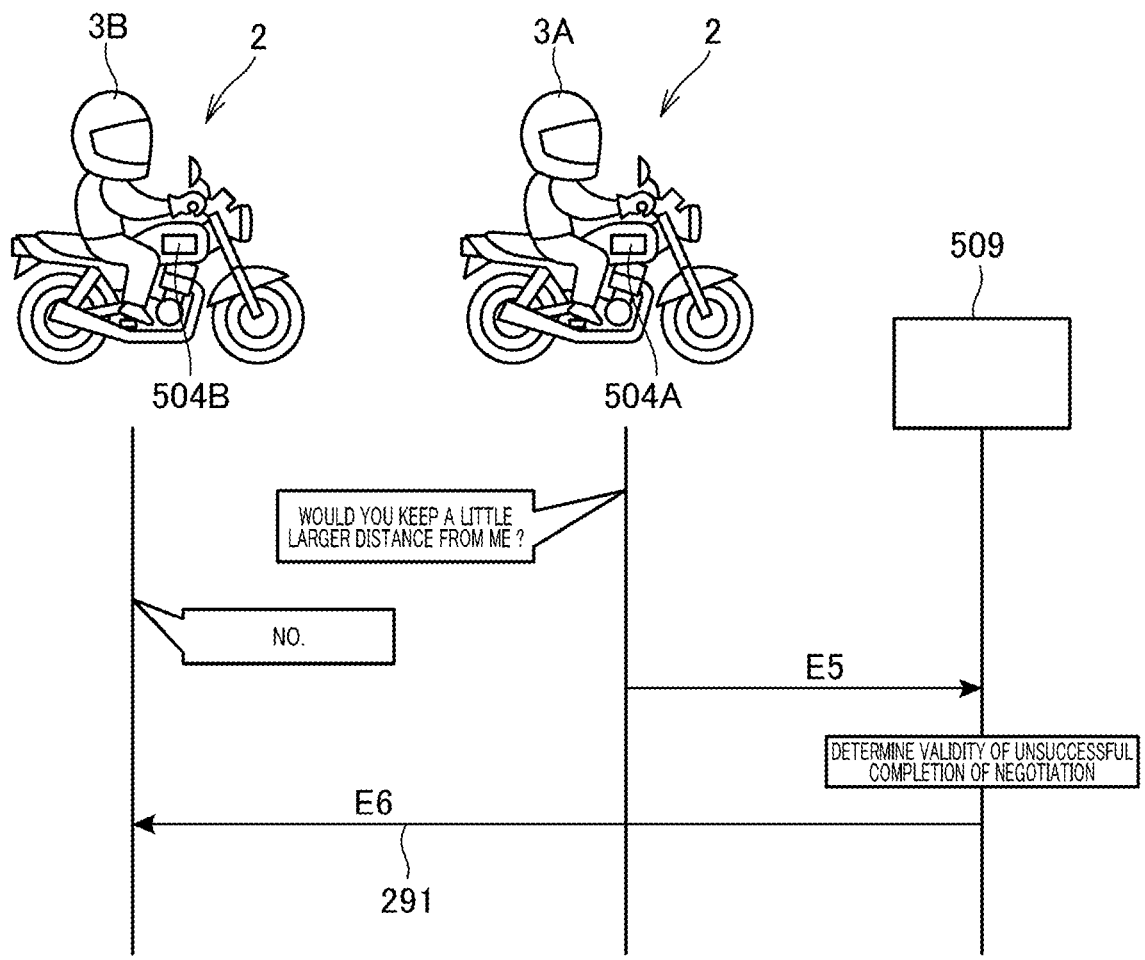
FIG. 24 is a sequence diagram of an AI-to-AI dialog system according to a modification 2B to the second application example.

In this case, a first information processing terminal 504A, for example, conducts a negotiation in which an inter-vehicle distance is set to at least a "predetermined distance" or more with the motorcycle 2 which travels behind as a negotiation partner in a proxy dialog, as illustrated in FIG. 24. If the negotiation has been unsuccessfully completed or if the negotiation has been unsuccessfully completed in practice because a subsequent negotiation partner continues to reduce an inter-vehicle distance to a predetermined distance or less, the first information processing terminal 504A transmits a confirmation request E5 for confirming validity of the negotiation to the dialog processing server 9.

The dialog processing server 9 transmits, when it determines that the unsuccessful completion of the negotiation is not valid, an acceptance instruction E6 to the subsequent vehicle as the negotiation partner. When the subsequent vehicle increases an inter-vehicle distance to a predetermined distance or more upon receiving the acceptance instruction E6, a predetermined inter-vehicle distance or more is ensured. In this case, it is not unreasonable that the negotiation is unsuccessfully completed if it is not preferable that the predetermined inter-vehicle distance or more is ensured in view of a situation at the time of traveling or if a "predetermined distance" is a long distance in view of a general common knowledge, for example. Accordingly, the dialog processing server 9 does not transmit the acceptance instruction E6. As a result, a valid inter-vehicle distance is always ensured.

Modification 2C

Either one of a first information processing terminal 504A and a second information processing terminal 504B as a negotiation partner may be installed in not only a movable body but also a building.

Figure 25:
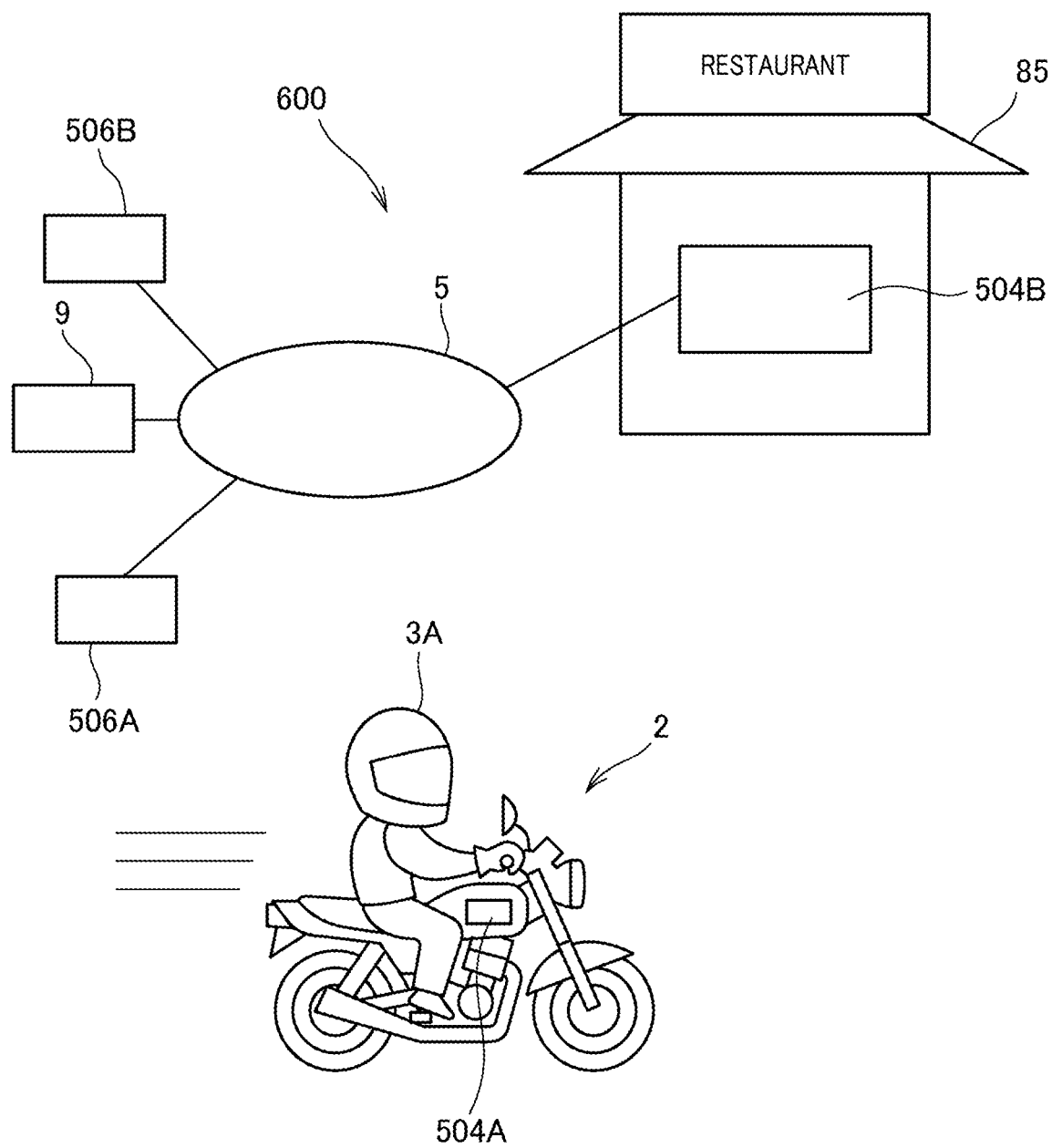
FIG. 25 is a diagram illustrating a configuration of an AI-to-AI dialog system according to a modification 2C to the second application example.

In an AI-to-AI dialog system 600 illustrated in FIG. 25, for example, the second information processing terminal 504B as a negotiation partner is installed in a restaurant 85. On the other hand, a negotiation task 67 in which a negotiation content 67A is "food and drink" and a desired condition 67B is "desired menu and price" is set in the first information processing terminal 504A loaded into a motorcycle 2.

In this case, when the first information processing terminal 504A comes close to a predetermined distance or less from the restaurant 85 while the motorcycle 2 is traveling, a negotiation by a proxy dialog is conducted between the first information processing terminal 504A and the second information processing terminal 504B. As a result of this, the user 3A can easily find the restaurant 85 in which something on a desired menu can be eaten or drunk at a desired price.

Note that when the second information processing terminal 504B as the negotiation partner is installed in a garage sale place, for example, in the AI-to-AI dialog system 600, the user 3A can easily find out an article desired at a desired price by a negotiation with the second information processing terminal 504B as the negotiation partner.

Modification 2D

As illustrated in FIG. 26, either one of a first information processing terminal 504A and a second information processing terminal 504B (the first information processing terminal 504A in an illustrated example) may be of a portable type owned by a user 3A, 3B.

In this case, the user 3A who owns the first information processing terminal 504A can conduct a negotiation by a proxy dialog with the second information processing terminal 504B in a motorcycle 2 positioned within a predetermined distance from himself or herself by setting a negotiation task 67 having a content desired by himself or herself in the first information processing terminal 504A.

The present modification can be used as follows.

That is, the modification is used in a way for the user 3A to request, when he or she desires to ride together on a motorcycle 2, a motorcycle 2 traveling around to ride together thereon through a negotiation by a proxy dialog. The way is useful if the user 3A misses a last train or if a passenger vehicle such as a taxi or a bus is not found around, for example.

In this case, the user 3A sets "ride together on a vehicle" in a negotiation content 67A in the negotiation task 67, and sets a "destination", a "consideration for together riding" or "demands (honesty, generosity, sociability, etc.) for a personality of an owner 106 of a motorcycle 2", for example, in a desired condition 67B.

As a result, every time the motorcycle 2 appears within a range of a predetermined distance from the user 3A, a negotiation requesting together riding is conducted by a proxy dialog. Accordingly, the user 3A can find a user 3B of a motorcycle 2 who willingly consents to ride together.

Note that a second AI server 506B on the side of a negotiation partner may specify a schedule for a behavior of the user 3B at that time based on user information 57 at the time of a proxy dialog operation and determine whether or not the negotiation is rejected depending on whether or not a schedule is tight. In addition to this, the second AI server 506B may know by analogy a determination by the user 3A for a request of together riding based on a feeling ("impatience", "calm", "anxiety", "pleasure", etc.) at that time and a personality of the user 3B and reflect an analogy result on a response of a negotiation of together riding.

Third Application

Figure 27:
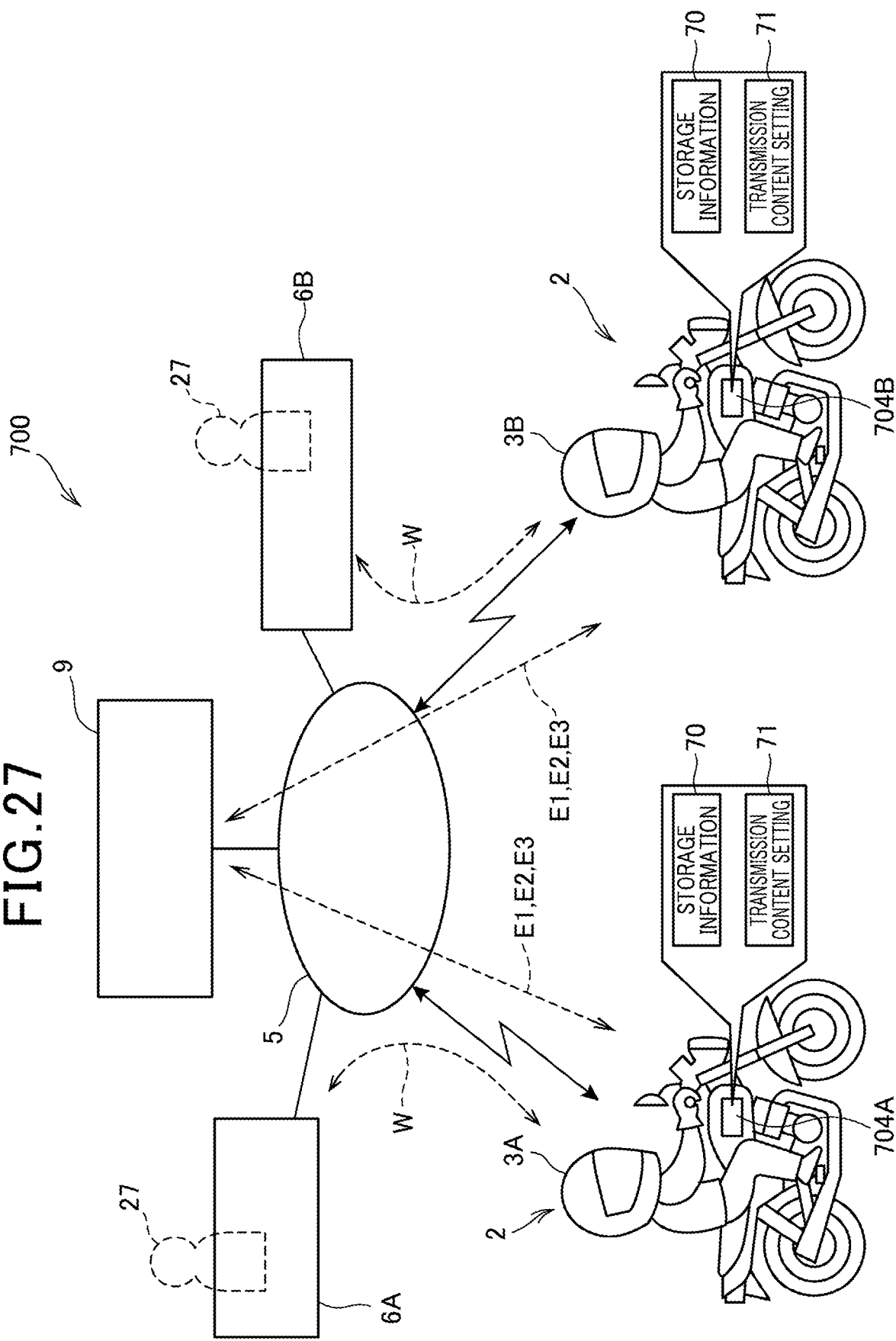
FIG. 27 is a diagram illustrating a configuration of an AI-to-AI dialog system according to a third application example of the present invention.

FIG. 27 is a diagram illustrating a configuration of an AI-to-AI dialog system 700 according to the present application example.

In the present application example, an AI-to-AI dialog using respective storage information 70 in a first information processing terminal 704A and a second information processing terminal 704B as a topic (hereinafter referred to as an "information transmission dialog") is conducted when a dialog condition is established, to enable transmission of the storage information 70.

In the present application example, the dialog condition is that a distance between the first information processing terminal 704A and the second information processing terminal 704B is a predetermined distance or less, like in the first embodiment.

The storage information 70 are each various types of information and can be respectively collected by the first information processing terminal 704A and the second information processing terminal 704B via sensor interfaces 16.

A transmission content setting 71 is stored in each of the first information processing terminal 704A and the second information processing terminal 704B. The transmission content setting 71 is setting information which specifies a provision permission content 71A for permitting provision to an information transmission partner among the storage information 70.

Figure 28:
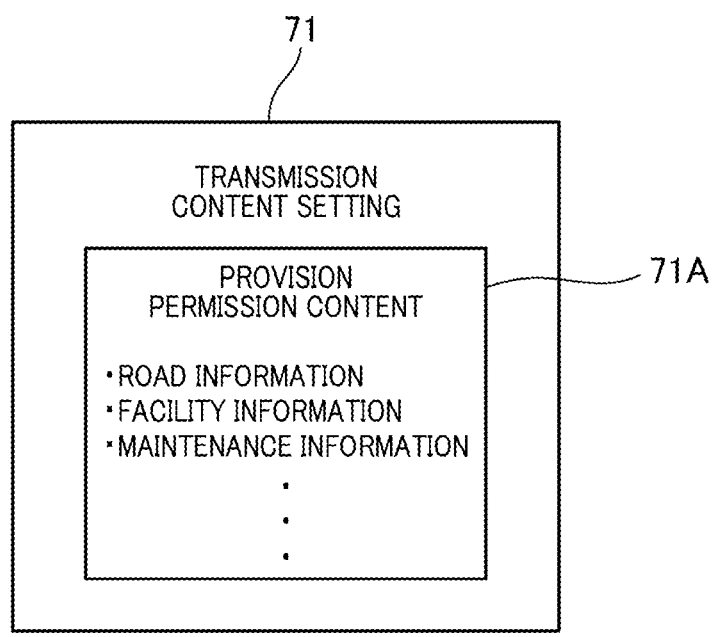
FIG. 28 is a schematic view of a transmission content setting.

FIG. 28 is a schematic view of the transmission content setting 71.

The provision permission content 71A is previously set by each of users 3A and 3B, and contents such as "road information", "facility information", and "maintenance information" are set as contents to be permitted. The "road information" is information about a road on which a motorcycle 2 has traveled so far, and examples of the "road information" include a congestion situation, a traffic control, and a road surface condition. The "facility information" is information about a facility at which the motorcycle 2 has stopped so far. The "maintenance information" is information about a maintenance which has been done so far for the motorcycle 2, and is information about a repair area, a part replaced or added, and a product name of engine oil. The "maintenance information" also includes a performance change (a fuel consumption, etc.) occurring in the motorcycle 2 after the maintenance.

Figure 29:
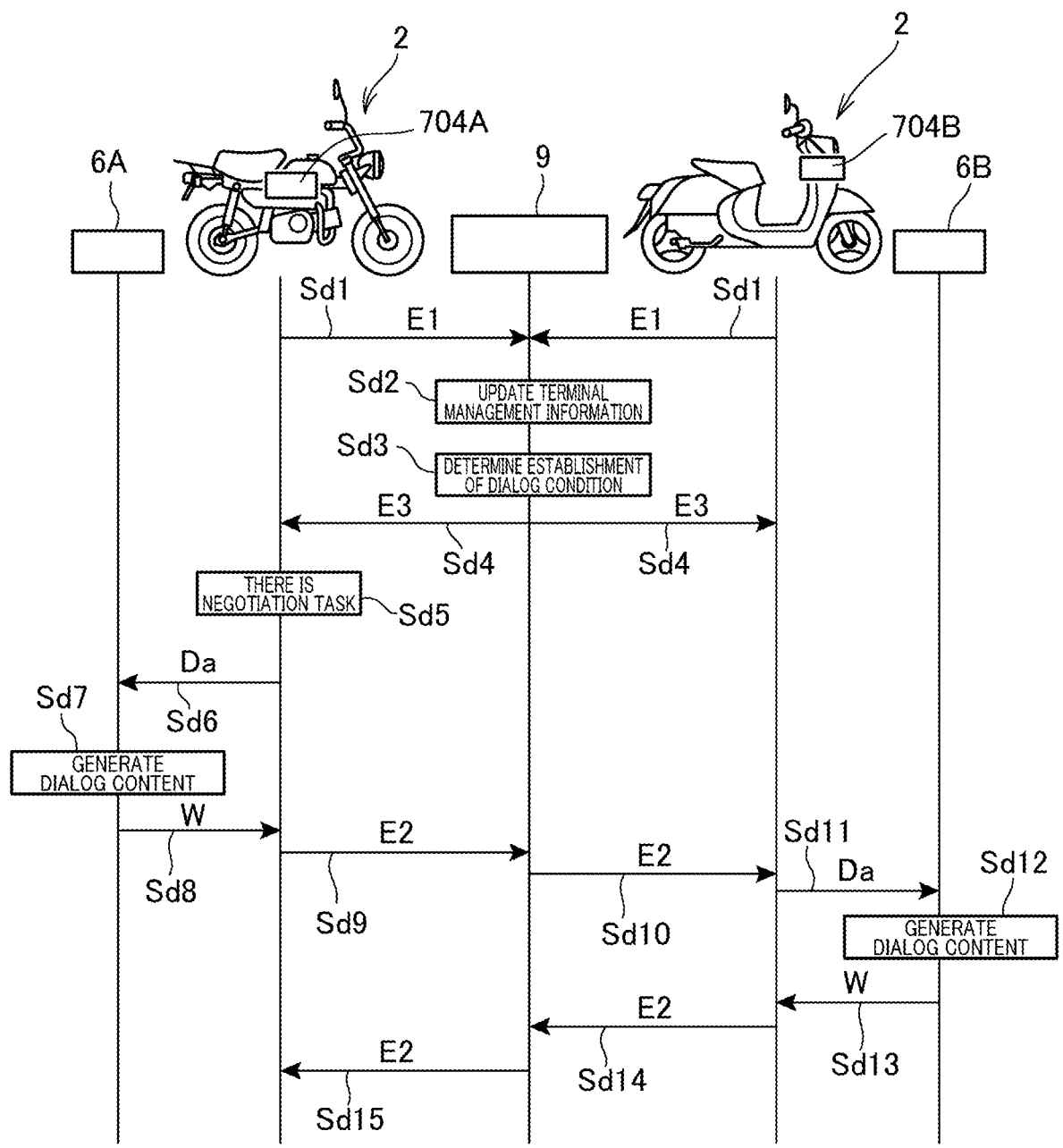
FIG. 29 is a sequence diagram of the AI-to-AI dialog system according to the third application example.

FIG. 29 is a sequence diagram of the AI-to-AI dialog system 700.

Processes in steps Sd1 to Sd4 are similar to those in steps Sa1 to Sa4 in the first embodiment.

When the first information processing terminal 704A, for example, starts a dialog for transmitting the storage information 70 to the second information processing terminal 704B (step Sd5), the first information processing terminal 704A extracts information to be transmitted from the storage information 70 based on the transmission content setting 71, and transmits the information to be transmitted to the first AI server 6A with the information included in input data Da (step Sd6). The first AI server 6A generates, when it receives the input data Da, a dialog content W based on the information to be transmitted (step Sd7), and transmits the dialog content W to the first information processing terminal 704A (step Sd8).

Subsequent steps Sd9 to Sd15 are similar to steps Sa10 to Sa15 described in the first embodiment.

Note that in step Sd12, a second AI server 6B may generate a dialog content W for requesting to provide another information depending on a flow of a dialog and a surrounding situation. In this case, the first AI server 6A generates a dialog content W responding to the request.

Figure 30:
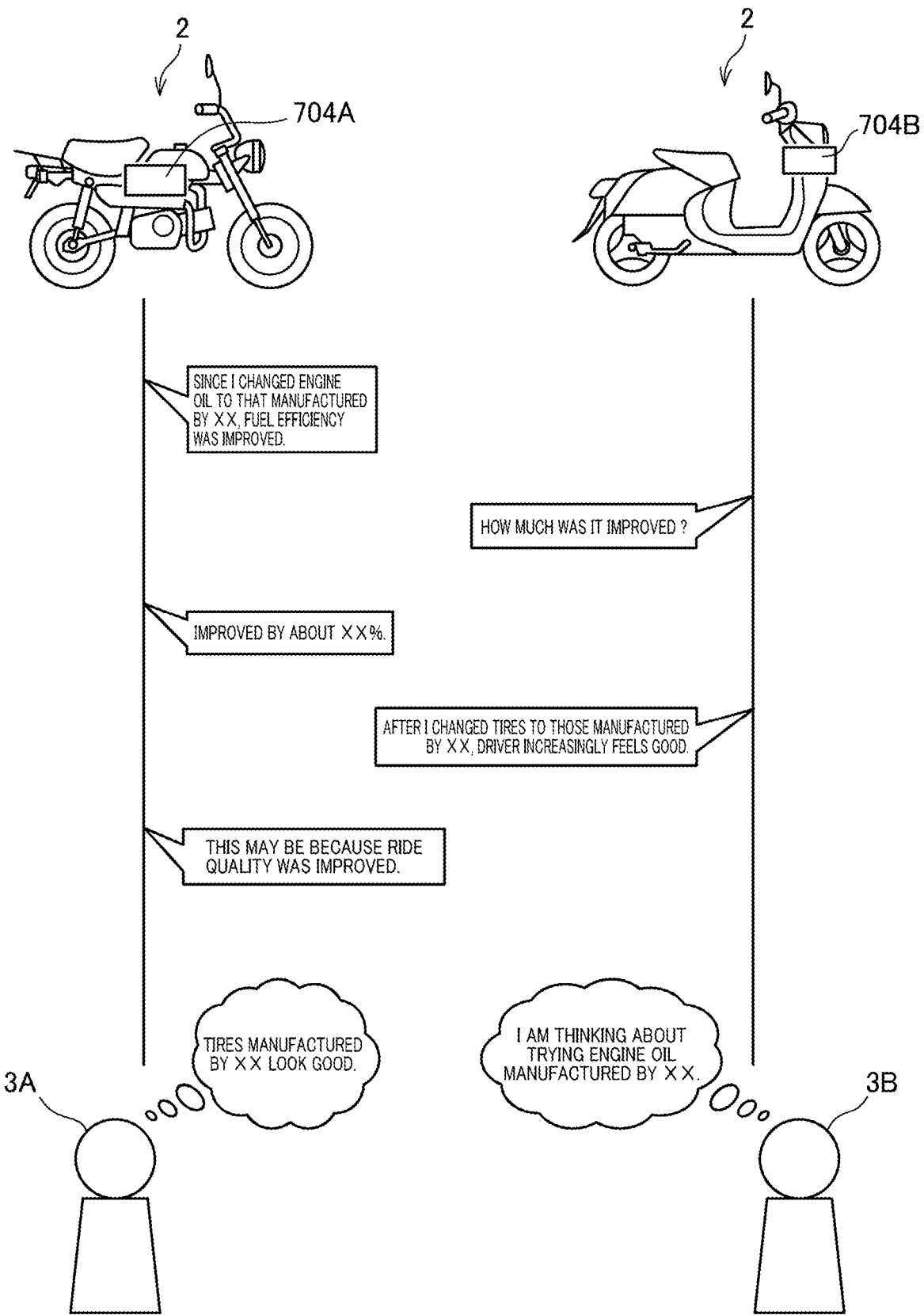
FIG. 30 is a schematic view illustrating a dialog example in an information transmission dialog in a timeline format.

FIG. 30 is a schematic view illustrating a dialog example in an information transmission dialog in a timeline format.

FIG. 30 illustrates a case where the provision permission content 71A is "maintenance information". As illustrated in FIG. 30, the first information processing terminal 704A conducts an information transmitted dialog with the other second information processing terminal 704B within a predetermined distance, so that respective information about maintenances, which have been done in the past for the motorcycles 2, are shared by transmitting and receiving the dialog contents W. The users 3A and 3B can know useful maintenance information, respectively, via the dialog contents W.

According to the present application example, the following effect is produced.

In the present application example, the storage information 70 are transmitted and received between AI units 35 (virtual humans 27) in the first AI server 6A and the second AI server 6B, respectively, via the dialog contents W, so that the storage information 70 are shared between the AI units 35.

Only the storage information 70 having contents respectively previously permitted by the users 3A and 3B are to be transmitted and received. Accordingly, information transmission against respective intentions of the users 3A and 3B is prevented.

Note that the present application example can be applied as follows.

Modification 3A

A first AI server 6A and a second AI server 6B may respectively acquire storage information 70 and provision permission contents 71A from a first information processing terminal 704A and a second information processing terminal 704B, and AI units 35 may respectively determine information to be transmitted.

If the provision permission content 71A is "road information", for example, the AI unit 35 extracts information about a road on which a motorcycle 2 has traveled in the past from the storage information 70, and generates a dialog content W including the information.

At this time, the AI unit 35 may select information included in the dialog content W in response to a situation (weather, a traveling spot, a traveling direction of a motorcycle 2 as an information transmission partner, etc.) surrounding each of the first information processing terminal 704A and the second information processing terminal 704B.

As a result, information useful for the motorcycle 2 as the information transmission partner existing under the same situation or the user 3A, 3B of the motorcycle 2 becomes easy to be transmitted. If the current weather is bad and the motorcycle 2 as the information transmission partner is an oncoming vehicle, for example, a road surface condition of a road on which the motorcycle 2 has traveled most recently is included in the dialog content W.

If the provision permission content 71A is "maintenance information", for example, the AI unit 35 extracts information about a past maintenance from the storage information 70, and generates the dialog content W including the information.

At this time, the AI unit 35 preferentially selects information useful for the information transmission partner, such as a vehicle type and a manufacturer of the motorcycle 2 as the information transmission partner, a performance of the motorcycle 2 as an own vehicle, or a maintenance content which has satisfactorily changed in a feeling of the user 3A, 3B from the storage information 70.

REFERENCE SIGNS LIST 1, 100, 200, 300, 400, 500, 600, 700 AI-to-AI dialog system
2 Motorcycle
3A, 3B User
4A, 104A, 304A, 404A, 504A, 604A, 704A First information processing terminal
4B, 104B, 304B, 404B, 504B, 604B, 704B Second information processing terminal
5 Communication line
6A, 406A, 506A First AI server
6B, 406B, 506B Second AI server
9 Dialog processing server
27 Virtual human
29 Input data acquisition unit
30 AI interface unit
32 Dialog content reproduction unit
33 Input data transmission unit
34 Dialog content reception unit 35 AI unit
36 Input unit
37 Dialog content generation unit
38 History storage unit
39 Output unit
40 Feeling reflection unit
41 Character formation unit
42 Monitoring unit
43 Storage unit
44 Relay unit
45 Determination unit
47 Terminal management information
48 Smartphone
57 User information
60 Person detection unit
61 User information acquisition unit
62 Vehicle information storage unit
62A Vehicle information
63 Compatibility reflection unit
64 Compatibility determination unit
65 Determination output unit
67 Negotiation task
68 Negotiation unit
70 Storage information
71 Transmission content setting
71A Provision permission content
Da Input data
W Dialog content

The invention claimed is:

1. A dialog processing server comprising a server computer, wherein the server computer functions to:
communicate with each of a first terminal computer and a second terminal computer each serving as a portable or vehicle-mounted terminal computer including an input/output interface unit with an artificial intelligence provided outside; and
determine whether or not a predetermined dialog condition is established,
wherein between the artificial intelligence with which the first terminal computer communicates and the artificial intelligence with which the second terminal computer communicates, the server computer enables dialog contents respectively generated by the artificial intelligences to be transmitted and received when the dialog condition is established,
the dialog contents are respectively speeches relating to the topic previously set by the users,
the topic includes a negotiation conducted between the artificial intelligences, and
when the negotiation is unsuccessfully completed between the artificial intelligences, the server computer determines validity of the unsuccessful completion of the negotiation based on the dialog contents transmitted and received in the negotiation, and the server computer instructs the first terminal computer or the second terminal computer as a partner in the negotiation to accept the negotiation when the server computer determines that the unsuccessful completion of the negotiation is not valid.

2. The dialog processing server according to claim 1, wherein the predetermined dialog condition includes a distance between the first terminal computer and the second terminal computer.

3. The dialog processing server according to claim 1, further comprising means for relaying the dialog contents between the first terminal computer and the second terminal computer.

4. The dialog processing server according to claim 1, wherein the dialog contents are respectively speeches when the artificial intelligences are chatting with each other.

5. The server according to claim 4, wherein
the chat includes a topic about a product associated with the first terminal computer and the second terminal computer.

6. The dialog processing server according to claim 5, wherein each of the artificial intelligences learns information for promoting sales of the product until the product is purchased.

7. The dialog processing server according to claim 1, wherein the dialog contents are respectively speeches including information previously permitted by the users among information stored in the first terminal computer and the second terminal computer.

8. A dialog processing server comprising a server computer, wherein the server computer functions to:
communicate with each of a first terminal computer and a second terminal computer each serving as a portable or vehicle-mounted terminal computer and loaded with an artificial intelligence; and
determine whether or not a predetermined dialog condition is established,
wherein between the artificial intelligence loaded into the first terminal computer and the artificial intelligence loaded into the second terminal computer, the server computer enables dialog contents respectively generated by the artificial intelligences to be transmitted and received when the dialog condition is established,
the dialog contents are respectively speeches relating to the topic previously set by the users,
the topic includes a negotiation conducted between the artificial intelligences, and
when the negotiation is unsuccessfully completed between the artificial intelligences, the server computer determines validity of the unsuccessful completion of the negotiation based on the dialog contents transmitted and received in the negotiation, and the server computer instructs the first terminal computer or the second terminal computer as a partner in the negotiation to accept the negotiation when the server computer determines that the unsuccessful completion of the negotiation is not valid.

9. A dialog processing server comprising a server computer, wherein the server computer functions to:
communicate with each of a first terminal computer serving as a portable or vehicle-mounted terminal computer and loaded with an artificial intelligence and a second terminal computer serving as a portable or vehicle-mounted terminal computer and including an input/output interface unit with an artificial intelligence provided outside; and
determine whether or not a predetermined dialog condition is established,
wherein between the artificial intelligence loaded into the first terminal computer and the artificial intelligence with which the second terminal computer communicates, the server computer enables dialog contents respectively generated by the artificial intelligences to be transmitted and received when the dialog condition is established,
the dialog contents are respectively speeches relating to the topic previously set by the users,
the topic includes a negotiation conducted between the artificial intelligences, and when the negotiation is unsuccessfully completed between the artificial intelligences, the server computer determines validity of the unsuccessful completion of the negotiation based on the dialog contents transmitted and received in the negotiation, and the server computer instructs the first terminal computer or the second terminal computer as a partner in the negotiation to accept the negotiation when the server computer determines that the unsuccessful completion of the negotiation is not valid.

10. A method for controlling a dialog processing server comprising a step of communicating with each of a first terminal computer and a second terminal computer each serving as a portable or vehicle-mounted terminal computer including an input/output interface unit with an artificial intelligence provided outside, the control method comprising:
a step of determining whether or not a predetermined dialog condition is established; and
a step of enabling, between the artificial intelligence with which the first terminal computer communicates and the artificial intelligence with which the second terminal computer communicates, dialog contents respectively generated by the artificial intelligences to be transmitted and received when the dialog condition is established,
wherein the dialog contents are respectively speeches relating to the topic previously set by the users,
the topic includes a negotiation conducted between the artificial intelligences, and
wherein the control method further comprising a step of determining validity of the unsuccessful completion of the negotiation based on the dialog contents transmitted and received in the negotiation, and a server computer, of the dialog processing server, instructs the first terminal computer or the second terminal computer as a partner in the negotiation to accept the negotiation when the server computer determines that the unsuccessful completion of the negotiation is not valid, when the negotiation is unsuccessfully completed between the artificial intelligences.

11. A method for controlling a dialog processing server comprising for a step of communicating with each of a first terminal computer and a second terminal computer each serving as a portable or vehicle-mounted terminal computer and loaded with an artificial intelligence, the control method comprising:
a step of determining whether or not a predetermined dialog condition is established; and
a step of enabling, between the artificial intelligence loaded into the first terminal computer and the artificial intelligence loaded into the second terminal computer, dialog contents respectively generated by the artificial intelligences to be transmitted and received when the dialog condition is established,
wherein the dialog contents are respectively speeches relating to the topic previously set by the users,
the topic includes a negotiation conducted between the artificial intelligences, and
the control method further comprising a step of determining validity of the unsuccessful completion of the negotiation based on the dialog contents transmitted and received in the negotiation, and a server computer, of the dialog processing server, instructs the first terminal computer or the second terminal computer as a partner in the negotiation to accept the negotiation when the server computer determines that the unsuccessful completion of the negotiation is not valid, when the negotiation is unsuccessfully completed between the artificial intelligences.

12. A method for controlling a dialog processing server comprising for a step of communicating with each of a first terminal computer serving as a portable or vehicle-mounted terminal computer and loaded with an artificial intelligence and a second terminal computer serving as a portable or vehicle-mounted terminal computer including an input/output interface unit with an artificial intelligence provided outside, the control method comprising:
a step of determining whether or not a predetermined dialog condition is established; and
a step of enabling, between the artificial intelligence loaded into the first terminal computer and the artificial intelligence with which the second terminal computer communicates, dialog contents respectively generated by the artificial intelligences to be transmitted and received when the dialog condition is established,
wherein the dialog contents are respectively speeches relating to the topic previously set by the users,
the topic includes a negotiation conducted between the artificial intelligences, and
wherein the control method further comprising a step of determining validity of the unsuccessful completion of the negotiation based on the dialog contents transmitted and received in the negotiation, and a server computer, of the dialog processing server, instructs the first terminal computer or the second terminal computer as a partner in the negotiation to accept the negotiation when the server computer determines that the unsuccessful completion of the negotiation is not valid, when the negotiation is unsuccessfully completed between the artificial intelligences.

13. A portable or vehicle-mounted terminal computer comprising:
a processor; and
an input/output interface unit with an artificial intelligence provided outside, or an artificial intelligence,
wherein the processor functions to communicate with a dialog processing server which determines whether or not a predetermined dialog condition is established by a server computer,
the dialog contents are respectively speeches relating to the topic previously set by the users,
the topic includes a negotiation conducted between the artificial intelligences, and
when the negotiation is unsuccessfully completed between the artificial intelligences, and when the server computer determines that the unsuccessful completion of the negotiation is not valid, the processor receives an instruction to accept the negotiation.

* * * * *